(12) United States Patent
Han et al.

(10) Patent No.: US 11,942,955 B2
(45) Date of Patent: Mar. 26, 2024

(54) DELAY LINE, A DELAY LOCKED LOOP CIRCUIT AND A SEMICONDUCTOR APPARATUS USING THE DELAY LINE AND THE DELAY LOCKED LOOP CIRCUIT

(71) Applicant: SK hynix Inc., Icheon-si (KR)

(72) Inventors: Yun Tack Han, Icheon-si (KR); Kyeong Min Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/326,671

(22) Filed: May 31, 2023

(65) Prior Publication Data

US 2023/0308103 A1 Sep. 28, 2023

Related U.S. Application Data

(60) Division of application No. 17/347,312, filed on Jun. 14, 2021, now Pat. No. 11,750,201, which is a
(Continued)

(30) Foreign Application Priority Data

Sep. 6, 2019 (KR) .................. 10-2019-0110563
Sep. 6, 2019 (KR) .................. 10-2019-0110569

(51) Int. Cl.
*H03L 7/081* (2006.01)
*H03K 5/134* (2014.01)
(Continued)

(52) U.S. Cl.
CPC .......... *H03L 7/0816* (2013.01); *H03K 5/134* (2014.07); *H03L 7/0895* (2013.01); *H03L 7/087* (2013.01)

(58) Field of Classification Search
CPC ... H03L 7/0816; H03L 7/0818; H03L 7/0896; H03L 7/07; H03L 7/0814; H03L 7/0898; H03K 5/14; H03K 5/131
See application file for complete search history.

(56) References Cited

U.S. PATENT DOCUMENTS

| | | |
|---|---|---|
| 5,304,867 A | 4/1994 | Morris |
| 6,094,103 A | 7/2000 | Jeong et al. |

(Continued)

FOREIGN PATENT DOCUMENTS

| | | |
|---|---|---|
| KR | 100970808 B1 | 7/2010 |
| KR | 101606187 B1 | 3/2016 |
| KR | 1020180046429 A | 5/2018 |

OTHER PUBLICATIONS

Kuo-Sing Cheng et al., A Wide-Range DLL-based Clock Generator with Phase Error Calibration, 2008 15th IEEE International Conference on Electronics, Circuits and Systems, Aug. 31-Sep. 3, 2008, pp. 798-801, St. Julien's, Malta.

(Continued)

*Primary Examiner* — Patrick C Chen
(74) *Attorney, Agent, or Firm* — William Park & Associates Ltd.

(57) ABSTRACT

A delay locked loop circuit includes a delay line, a phase detector, a selection controller, and a charge pump. The delay line delays, based on a delay control voltage, a reference clock signal to generate an internal clock signal and a feedback clock signal. The phase detector compares phases of the internal clock signal and the feedback clock signal to generate a first detection signal and a second detection signal. The selection controller provides the reference clock signal as an up-signal and a down-signal. The charge pump generates the delay control voltage based on the up-signal and the down-signal.

9 Claims, 20 Drawing Sheets

Related U.S. Application Data continuation-in-part of application No. 17/149,479, filed on Jan. 14, 2021, now abandoned, which is a continuation-in-part of application No. 16/911,888, filed on Jun. 25, 2020, now Pat. No. 11,206,026.

(51) Int. Cl.
*H03L 7/087* (2006.01)
*H03L 7/089* (2006.01)

(56) References Cited

U.S. PATENT DOCUMENTS

| | | | |
|---|---|---|---|
| 6,097,216 | A | 8/2000 | Youn |
| 6,198,322 | B1 | 3/2001 | Yoshimura |
| 6,867,627 | B1 * | 3/2005 | Murtagh .............. H03L 7/0816 327/158 |
| 7,149,145 | B2 * | 12/2006 | Kim .................... G11C 29/028 327/158 |
| 7,323,918 | B1 | 1/2008 | Tai |
| 7,486,119 | B2 | 2/2009 | Lee |
| 8,081,038 | B2 | 12/2011 | Lee et al. |
| 8,237,478 | B2 | 8/2012 | Yun et al. |
| 8,392,744 | B2 | 3/2013 | Lin |
| 8,599,984 | B2 | 12/2013 | Masenko et al. |
| 9,071,232 | B2 | 6/2015 | Kim et al. |
| 9,148,135 | B2 | 9/2015 | Li et al. |
| 9,602,115 | B1 | 3/2017 | Rozental et al. |
| 9,741,405 | B2 | 8/2017 | Suetinov et al. |
| 9,780,794 | B2 * | 10/2017 | Tu .......................... H03L 7/0816 |
| 2006/0023562 | A1 | 2/2006 | Kim et al. |
| 2008/0036514 | A1 | 2/2008 | Tai |
| 2008/0111633 | A1 | 5/2008 | Cranford et al. |
| 2008/0122502 | A1 | 5/2008 | Kim |
| 2008/0157837 | A1 | 7/2008 | Na |
| 2008/0164920 | A1 | 7/2008 | Cho |
| 2009/0066379 | A1 | 3/2009 | Kim et al. |
| 2009/0240970 | A1 | 9/2009 | Lin |
| 2011/0128056 | A1 | 6/2011 | An |
| 2012/0137161 | A1 | 5/2012 | Harrison |
| 2013/0038369 | A1 | 2/2013 | Lee et al. |
| 2015/0130520 | A1 | 5/2015 | Matsuda |
| 2016/0043860 | A1 | 2/2016 | Tu et al. |

OTHER PUBLICATIONS

Po-Chun Huang et al., A Phase Error Calibration DLL with Edge Combiner for Wide-Range Operation, 2011 IEEE 9th International New Circuits and systems conference, Jun. 26-29, 2011, pp. 1-4, Bordeaux, France.

Shao-Ku Kao, A delay-locked loop with self-calibration circuit for reducing phase error, Microelectronics Journal 44, Apr. 22, 2013, pp. 663-669, Elsevier Ltd.

Wei-Hao Chiu et al., A Dynamic Phase Error Compensation Technique for Fast-Locking Phase-Locked Loops, IEEE Journal of Solid-State Circuits, Jun. 2010, pp. 1137-1149, vol. 45, No. 6.

* cited by examiner

__US 11,942,955 B2__

DELAY LINE, A DELAY LOCKED LOOP CIRCUIT AND A SEMICONDUCTOR APPARATUS USING THE DELAY LINE AND THE DELAY LOCKED LOOP CIRCUIT

CROSS-REFERENCES TO RELATED APPLICATION

The present application is a divisional application of U.S. application Ser. No. 17/347,312, filed on Jun. 14, 2021, which is a continuation-in-part application of U.S. application Ser. No. 17/149,479, filed on Jan. 14, 2021, which is a continuation-in-part of U.S. application Ser. No. 16/911,888, filed on Jun. 25, 2020, and claims priority under 35 U.S.C. § 119(a) to Korean Application numbers 10-2019-0110563 and 10-2019-0110569, filed on Sep. 6, 2019, in the Korean Intellectual Property Office, which is incorporated herein by reference in its entirety.

BACKGROUND

1. Technical Field

Various embodiments generally relate to an integrated circuit technology, and more particularly, to a delay line, a delay locked loop circuit and a semiconductor apparatus using the delay line and delay locked loop.

2. Related Art

An electronic device includes a lot of electronic elements and, a computer system may include a lot of semiconductor apparatuses each configured by a semiconductor. Semiconductor apparatuses configuring a computer system may communicate with one another by transmitting and receiving a clock signal and data. The semiconductor apparatus may operate in synchronization with a clock signal. The semiconductor apparatus may transmit and/or receive a system clock signal to and/or from an external apparatus (i.e., another semiconductor apparatus) and may transmit and/or receive data to and/or from the external apparatus in synchronization with the system clock signal. The semiconductor apparatus may include a clock buffer and/or a receiver to receive the system clock signal and may transfer the received system clock signal to an internal circuit related to data input/output operation and an internal circuit operative in synchronization with a clock signal. Therefore, there may occur phase difference between the system clock signal and the clock signal, which the internal circuits receive, due to delay time occurring within the semiconductor apparatus. Therefore, the semiconductor apparatus includes a delay locked loop circuit to compensate for the above-described phase difference. In general, examples of the delay locked loop circuit are a digital delay locked loop utilizing a digitally controlled delay line and an analog delay locked loop utilizing a voltage-controlled delay line.

SUMMARY

In accordance with an embodiment, a delay locked loop circuit may include a frequency detector, a delay line, a phase detector, a selection controller and a charge pump. The frequency detector may be configured to detect a frequency of a reference clock signal to generate a frequency detection signal. The delay line may be configured to delay, based on a delay control voltage, the reference clock signal to generate an internal clock signal and a feedback clock signal. The phase detector may be configured to compare phases of the internal clock signal and the feedback clock signal to generate a first detection signal and a second detection signal. The selection controller may be configured to provide the first detection signal and the second detection signal respectively as an up-signal and a down-signal or to provide the reference clock signal as the up-signal and the down-signal, based on the frequency detection signal. The charge pump may be configured to generate the delay control voltage based on the up-signal and the down-signal.

In accordance with an embodiment, a delay locked loop circuit may include a delay line, a selection controller, a phase detector and a charge pump. The delay line may be configured to delay, based on a delay control voltage, a reference clock signal to generate an internal clock signal and a feedback clock signal. The selection controller may be configured to provide the internal clock signal and the feedback clock signal respectively as a first selection clock signal and a second selection clock signal or to provide the reference clock signal as the first selection clock signal and the second selection clock signal, based on a deterioration enable signal. The phase detector may be configured to compare phases of the first selection clock signal and the second selection clock signal to generate an up-signal and a down-signal. The charge pump may be configured to generate the delay control voltage based on the up-signal and the down-signal.

In accordance with an embodiment, a delay locked loop circuit may include a delay line, a phase detector, a selection controller and a charge pump. The delay line may be configured to delay, based on a delay control voltage, a reference clock signal to generate an internal clock signal and a feedback clock signal. The phase detector may be configured to compare phases of the internal clock signal and the feedback clock signal to generate a first detection signal and a second detection signal. The selection controller may be configured to provide the first detection signal and the second detection signal respectively as an up-signal and a down-signal or to provide the reference clock signal as the up-signal and the down-signal, based on a deterioration enable signal. The charge pump may be configured to generate the delay control voltage based on the up-signal and the down-signal.

DETAILED DESCRIPTION

Figure 1:
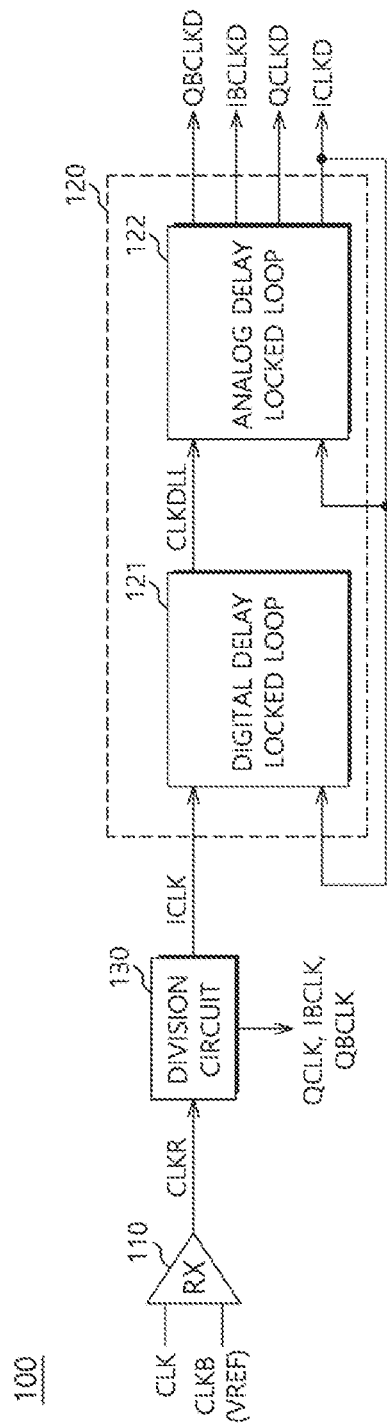
FIG. 1 is a diagram illustrating a configuration of a semiconductor apparatus in accordance with an embodiment.

FIG. 1 is a diagram illustrating a configuration of a semiconductor apparatus 100 in accordance with an embodiment. Referring to FIG. 1, the semiconductor apparatus 100 may receive a clock signal CLK to generate a plurality of internal clock signals. The clock signal CLK may be an external clock signal provided from an external apparatus coupled to the semiconductor apparatus 100. In an embodiment, the clock signal CLK may be a periodic signal generated from a clock generator such as an oscillator. The semiconductor apparatus 100 may perform a delay-locking operation on the clock signal CLK to generate the plurality of internal clock signals. The semiconductor apparatus 100 may include a delay locked loop circuit including at least two delay locked loops, which have different characteristics from each other. The delay locked loop circuit may perform the delay-locking operation on the clock signal CLK through at least one between the two delay locked loops. The two delay locked loops may include a digital delay locked loop and an analog delay locked loop.

The semiconductor apparatus 100 may include a clock receiver 110 and a delay locked loop circuit 120. The clock receiver 110 may receive the clock signal CLK. The clock receiver 110 may receive the clock signal CLK to output a buffered clock signal CLKR. The clock signal CLK may be transmitted, together with a complementary signal CLKB, as a differential signal. The clock signal CLK may be transmitted as a single-ended signal. When the clock signal CLK is transmitted as a differential signal, the clock receiver 110 may differentially amplify the clock signal CLK and the complementary signal CLKB to output the buffered clock signal CLKR. When the clock signal CLK is transmitted as a single-ended signal, the clock receiver 110 may differentially amplify the clock signal CLK and a reference voltage VREF to output the buffered clock signal CLKR. The reference voltage VREF may have a voltage level corresponding to a middle of the amplitude of the clock signal CLK.

The delay locked loop circuit 120 may receive a reference clock signal and may perform a delay-locking operation on the reference clock signal. The buffered clock signal CLKR generated from the clock receiver 110 may be provided as the reference clock signal. The semiconductor apparatus 100 may further include division circuit 130. The division circuit 130 may receive the buffered clock signal CLKR and may divide the frequency of the buffered clock signal CLKR to provide the divided clock signal as the reference clock signal. When the semiconductor apparatus 100 operates at a relatively low frequency, the delay locked loop circuit 120 may receive the buffered clock signal CLKR as the reference clock signal to perform a delay-locking operation. When the semiconductor apparatus 100 operates at a relatively high frequency, the delay locked loop circuit 120 may receive the clock signal, which is divided by the division circuit 130, as the reference clock signal to perform a delay-locking operation. The division circuit 130 may divide the buffered clock signal CLKR to generate a first divided clock signal ICLK, a second divided clock signal QCLK, a third divided clock signal IBCLK and a fourth divided clock signal QBCLK.

The first to fourth divided clock signals ICLK, QCLK, IBCLK and QBCLK may have lower frequencies or longer periods than the buffered clock signal CLKR. The first divided clock signal ICLK may have the same phase as the buffered clock signal CLKR and may have a leading phase to the second divided clock signal QCLK by an amount of 90 degrees. The second divided clock signal QCLK may have a leading phase to the third divided clock signal IBCLK by an amount of 90 degrees. The third divided clock signal IBCLK may have a leading phase to the fourth divided clock signal QBCLK by an amount of 90 degrees. The fourth divided clock signal QBCLK may have a leading phase to the first divided clock signal ICLK by an amount of 90 degrees. The delay locked loop circuit 120 may receive the first divided clock signal ICLK as the reference clock signal and may perform a delay-locking operation on the first divided clock signal ICLK. In an embodiment, the delay locked loop circuit 120 may receive the second divided clock signal QCLK as the reference clock signal and may perform a delay-locking operation on the second divided clock signal QCLK.

The delay locked loop circuit 120 may include a first delay locked loop 121 and a second delay locked loop 122. The first delay locked loop 121 may be a digital delay locked loop. The second delay locked loop 122 may be an analog delay locked loop. The first delay locked loop 121 may receive the reference clock signal and an internal reference clock signal. The first delay locked loop 121 may perform a delay-locking operation on the reference clock signal based on the reference clock signal and the internal reference clock signal to generate a delay locked clock signal CLKDLL. The second delay locked loop 122 may receive the delay locked clock signal CLKDLL and the internal reference clock signal. The second delay locked loop 122 may receive the delay locked clock signal CLKDLL and the internal reference clock signal and may perform a delay-locking operation on the delay locked clock signal CLKDLL to generate the internal reference clock signal.

For compensation for modelled delay time, the first delay locked loop 121 may delay the reference clock signal to generate the delay locked clock signal CLKDLL. The second delay locked loop 122 may adjust the phase of the delay locked clock signal CLKDLL and may generate, from the delay locked clock signal CLKDLL, a plurality of internal clock signals having different phases from one another. The plurality of internal clock signals may include a first internal clock signal ICLKD, a second internal clock signal QCLKD, a third internal clock signal IBCLKD and a fourth internal clock signal QBCLKD. The first internal clock signal ICLKD may be provided as the internal reference clock signal. The first internal clock signal ICLKD may have a leading phase to the second internal clock signal QCLKD by an amount of 90 degrees. The second internal clock signal QCLKD may have a leading phase to the third internal clock signal IBCLKD by an amount of 90 degrees. The third internal clock signal IBCLKD may have a leading phase to the fourth internal clock signal QBCLKD by an amount of 90 degrees. The fourth internal clock signal QBCLKD may have a leading phase to the first internal clock signal ICLKD by an amount of 90 degrees. The first to fourth internal clock signals ICLKD, QCLKD, IBCLKD and QBCLKD may be provided to internal circuits, which operate in synchronization with a clock signal among various internal circuits included in the semiconductor apparatus 100. Hereinafter, the terms "internal reference clock signal" and "internal clock signal" may indicate the same clock signal unless explicitly stated otherwise.

In general, a digital delay locked loop may be capable of performing a fast delay-locking operation and may perform a delay-locking operation on a clock signal having a broader frequency band than an analog delay locked loop. However, it may be difficult for a delay locked loop with one delay line to perform a delay-locking operation on a clock signal having a particular frequency or higher. A dual delay locked loop is designed to have two delay lines in order to settle the difficulty. However, there may easily occur a skew on phases of a plurality of internal clock signals generated from the dual delay locked loop due to process variation between the two delay lines. Therefore, in accordance with an embodiment, the semiconductor apparatus 100 adopts the delay locked loop circuit 120 having both of a digital delay locked loop and an analog delay locked loop, which makes it possible to perform a delay-locking operation on a clock signal having a high frequency and to generate a plurality of internal clock signals having precise phase difference.

Figure 2:
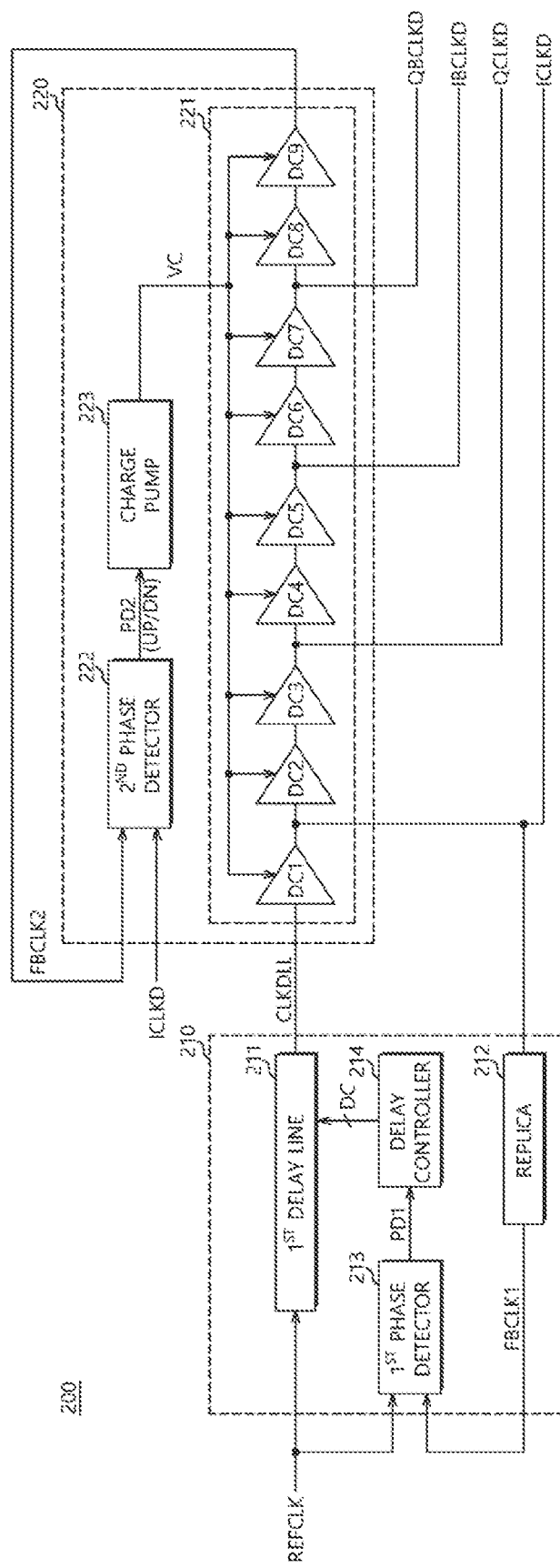
FIG. 2 is a diagram illustrating a configuration of a delay locked loop circuit in accordance with an embodiment.

FIG. 2 is a diagram illustrating a configuration of a delay locked loop circuit 200 in accordance with an embodiment. The delay locked loop circuit 200 may be applied as the delay locked loop circuit 120 illustrated in FIG. 1. Referring to FIG. 2, the delay locked loop circuit 200 may include a first delay locked loop 210 and a second delay locked loop 220. The first delay locked loop 210 may be a digital delay locked loop. The second delay locked loop 220 may be an analog delay locked loop. The first delay locked loop 210 may receive a reference clock signal REFCLK and an internal clock signal ICLKD. The first delay locked loop 210 may perform a delay-locking operation on the reference clock signal REFCLK based on the reference clock signal REFCLK and the internal clock signal ICLKD to generate a delay locked clock signal CLKDLL. The second delay locked loop 220 may receive the delay locked clock signal CLKDLL. The second delay locked loop 220 may perform a delay-locking operation on the delay locked clock signal CLKDLL to generate first to fourth internal clock signals ICLKD, QCLKD, IBCLKD and QBCLKD. Any one among the first to fourth internal clock signals ICLKD, QCLKD, IBCLKD and QBCLKD may be provided as the internal reference clock signal. For example, the first internal clock signal ICLKD may be utilized as the internal reference clock signal.

The first delay locked loop 210 may include a first delay line 211, a replica 212, a first phase detector 213 and a delay controller 214. The first delay line 211 may receive the reference clock signal REFCLK and a delay control signal DC. The first delay line 211 may delay the reference clock signal REFCLK based on the delay control signal DC to generate the delay locked clock signal CLKDLL. The first delay line 211 may be a digitally controlled delay line. A delay amount of the first delay line 211 may be set on the basis of the delay control signal DC. The first delay line 211 may delay the reference clock signal REFCLK by the delay amount, which is set by the delay control signal DC, to generate the delay locked clock signal CLKDLL.

The replica 212 may receive the internal clock signal ICLKD as the internal reference clock signal. The replica 212 may delay the internal clock signal ICLKD to generate a first feedback clock signal FBCLK1. The replica 212 may be designed by modelling a transmission path, through which the clock signal CLK is transferred within the semiconductor apparatus 100 illustrated in FIG. 1. Therefore, the replica 212 may have a delay amount corresponding to delay time occurring due to the transmission path, through which the clock signal CLK is transferred. The replica 212 may delay the internal reference clock signal by an amount of the modelled delay time to generate the first feedback clock signal FBCLK1.

The first phase detector 213 may receive the reference clock signal REFCLK and the first feedback clock signal FBCLK1. The first phase detector 213 may compare phases between the reference clock signal REFCLK and the first feedback clock signal FBCLK1 to generate a first phase detection signal PD1. The first phase detector 213 may change the logic level of the first phase detection signal PD1 depending on whether the reference clock signal REFCLK has a leading phase or a lagging phase to the first feedback clock signal FBCLK1. For example, the first phase detector 213 may generate, when the reference clock signal REFCLK has a leading phase to the first feedback clock signal FBCLK1, the first phase detection signal PD1 having a high logic level. For example, the first phase detector 213 may generate, when the reference clock signal REFCLK has a lagging phase to the first feedback clock signal FBCLK1, the first phase detection signal PD1 having a low logic level.

The delay controller 214 may receive the first phase detection signal PD1 to generate the delay control signal DC. The delay control signal DC may be a digital code signal having a plurality of bits. The delay controller 214 may change a code value of the delay control signal DC based on the first phase detection signal PD1. A delay amount of the first delay line 211 may increase or decrease depending on the code value of the delay control signal DC. The first delay locked loop 210 may perform a delay-locking operation by changing the code value of the delay control signal DC until the reference clock signal REFCLK and the first feedback clock signal FBCLK1 have the same phase. The first delay locked loop 210 may be locked by fixing and/or maintaining the code value of the delay control signal DC when the reference clock signal REFCLK and the first feedback clock signal FBCLK1 have the same phase. In an embodiment, the first delay locked loop 210 may generate the delay locked clock signal CLKDLL by performing a delay-locking operation on the reference clock signal REFCLK to set a delay of the reference clock signal REFCLK when a first feedback clock signal FBCLK1 has the same phase as the reference clock signal REFCLK.

The second delay locked loop 220 may include a second delay line 221, a second phase detector 222 and a charge pump 223. The second delay line 221 may receive the delay locked clock signal CLKDLL output from the first delay locked loop 210. The second delay line 221 may receive a delay control voltage VC and may delay the delay locked clock signal CLKDLL based on the delay control voltage VC to generate a plurality of delayed clock signals. The second delay line 221 may be a voltage-controlled delay line. A delay amount of the second delay line 221 may be set on the basis of the delay control voltage VC, which is an analog signal. The second delay line 221 may delay the delay locked clock signal CLKDLL by the delay amount, which is set by the delay control voltage VC, to generate the plurality of delayed clock signals. The second delay line 221 may output, as the first to fourth internal clock signals ICLKD, QCLKD, IBCLKD and QBCLKD, four among the plurality of delayed clock signals and may output, as a second feedback clock signal FBCLK2, another one among the plurality of delayed clock signals.

The second delay line 221 may include a plurality of delay cells. Although FIG. 2 exemplifies the second delay line 221 having nine delay cells DC1, DC2, DC3, DC4, DC5, DC6, DC7, DC8 and DC9, an embodiment will not be limited thereto. The number of delay cells included in the second delay line 221 may be greater or less than nine. Referring to FIGS. 1 and 2, one delay cell may be set to have delay time corresponding to a quarter of the period of the clock signal CLK. When any one between the first divided clock signal ICLK and the second divided clock signal QCLK output from the division circuit 130 provided as the reference clock signal REFCLK, the one delay cell may be set to have delay time corresponding to an eighth of the period of the reference clock signal REFCLK. The second delay line 221 may provide, as the first internal clock signal ICLKD, a delayed clock signal output from the first delay cell DC1. The first internal clock signal ICLKD may be provided as the internal reference clock signal. The second delay line 221 may provide, as the second internal clock signal QCLKD, a delayed clock signal output from the third delay cell DC3. The second delay line 221 may provide, as the third internal clock signal IBCLKD, a delayed clock signal output from the fifth delay cell DC5. The second delay line 221 may provide, as the fourth internal clock signal QBCLKD, a delayed clock signal output from the seventh delay cell DC7. The second delay line 221 may provide, as the second feedback clock signal FBCLK2, a delayed clock signal output from the last delay cell DC9.

The second phase detector 222 may receive the internal reference clock signal and the second feedback clock signal FBCLK2. The second phase detector 222 may generate a second phase detection signal PD2 based on the phases of the internal clock signal ICLKD, which is provided as the internal reference clock signal, and the second feedback clock signal FBCLK2. For example, the second phase detection signal PD2 may include an up signal UP and a down signal DN. The second phase detector 222 may enable the up signal UP based on the phase of the internal clock signal ICLKD. The second phase detector 222 may enable the down signal DN based on the phase of the second feedback clock signal FBCLK2. The second phase detector 222 may enable the up signal UP when the phase of the internal clock signal ICLKD transitions from a low logic level to a high logic level. The second phase detector 222 may enable the down signal DN when the phase of the second feedback clock signal FBCLK2 transitions from a low logic level to a high logic level. The second phase detector 222 may reset the up signal UP and the down signal DN when a predetermined time elapses. The second phase detector 222 may disable both of the up signal UP and the down signal DN when the predetermined time elapses from a time point, at which any signal is enabled later than the other signal between the up signal UP and the down signal DN. The predetermined time may be less than a time corresponding to a half of the period of the reference clock signal REFCLK and/or the second feedback clock signal FBCLK2. The word "predetermined" as used herein with respect to a parameter, such as a predetermined time and predetermined amount, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The charge pump 223 may receive the second phase detection signal PD2 and may generate the delay control voltage VC based on the second phase detection signal PD2. The charge pump 223 may raise the voltage level of the delay control voltage VC based on the up signal UP and may lower the voltage level of the delay control voltage VC based on the down signal DN. When the voltage level of the delay control voltage VC rises, the delay time of the delay cells DC1 to DC9 configuring the second phase detector 222 may decrease. When the voltage level of the delay control voltage VC lowers, the delay time of the delay cells DC1 to DC9 configuring the second phase detector 222 may increase. The second delay locked loop 220 may perform a delay-locking operation by changing the value of the delay control voltage VC until the internal reference clock signal and the second feedback clock signal FBCLK2 have the same phase. The second delay locked loop 220 may be locked by fixing and maintaining the voltage level of the delay control voltage VC when the internal reference clock signal and the second feedback clock signal FBCLK2 have the same phase. In an embodiment, the second delay locked loop 220 may generate the internal reference clock signal by performing a delay-locking operation on the delay locked clock signal CLKDLL to set a delay of the delay locked clock signal CLKDLL when a second feedback clock signal FBCLK2 has the same phase as the internal reference clock signal.

Figure 3:
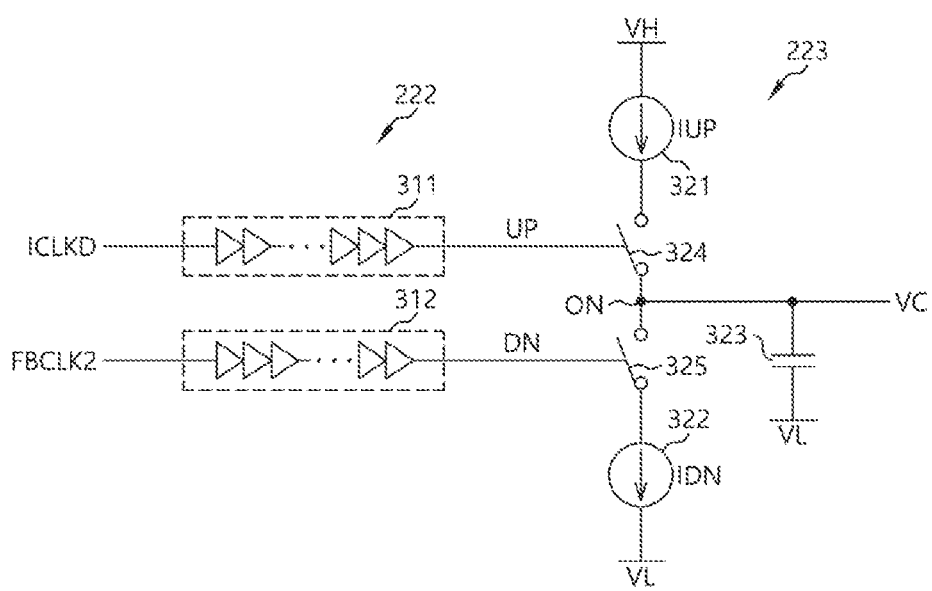
FIG. 3 is a diagram schematically illustrating configurations of a second phase detector and a charge pump illustrated in FIG. 2.

FIG. 3 is a diagram schematically illustrating configurations of the second phase detector 222 and the charge pump 223 illustrated in FIG. 2. The second phase detector 222 may include a first set of plural drivers 311 and a second set of plural drivers 312. The first set of plural drivers 311 may receive the first internal clock signal ICLKD and may generate the up signal UP by driving the first internal clock signal ICLKD. The second set of plural drivers 312 may receive the second feedback clock signal FBCLK2 and may generate the down signal DN by driving the second feedback clock signal FBCLK2.

The charge pump 223 may include a pull-up current source 321, a pull-down current source 322, a capacitor 323, a first switch 324 and a second switch 325. The pull-up current source 321 may be coupled between a node, from which a high voltage VH is provided, and an output node ON. The pull-up current source 321 may generate a pull-up current IUP. The delay control voltage VC may be generated from the output node ON. The pull-up current source 321 may be implemented by at least one P-channel MOS transistor configured to receive a bias voltage or a current control signal. The pull-down current source 322 may be coupled between the output node ON and a node, from which a low voltage VL is provided. The pull-down current source 322 may generate a pull-down current IDN. The low voltage VL may have a lower voltage level than the high voltage VH. The pull-down current source 322 may be implemented by at least one N-channel MOS transistor configured to a bias voltage or a current control signal. The capacitor 323 may be coupled to the output node ON at one end and may be coupled to the node, from which the low voltage VL is provided, at the other node. The voltage level of the output node ON and the delay control voltage VC may change depending on an amount of charge that is charged into the capacitor 323.

The first switch 324 may receive the up signal UP. The first switch 324 may couple the pull-up current source 321 to the output node ON based on the up signal UP. When the first switch 324 turned on according to the up signal UP, the pull-up current IUP may be provided to the output node ON and the capacitor 323 may be charged. Therefore, the voltage level of the output node ON and the delay control voltage VC may rise. The second switch 325 may receive the down signal DN. The second switch 325 may couple the pull-down current source 322 to the output node ON based on the down signal DN. When the second switch 325 is turned on according to the down signal DN, the pull-down current IDN may flow from the output node ON to the node, from which the low voltage VL is provided, and the capacitor 323 may be discharged. Therefore, the voltage level of the output node ON and the delay control voltage VC may lower.

There may be delay mismatch in the second phase detector 222 due to local process variation between the first set of plural drivers 311 and the second set of plural drivers 312. Therefore, there may occur an error between a time, at which the up signal UP is enabled according to a rising edge of the first internal clock signal ICLKD, and a time, at which the down signal DN is enabled according to a rising edge of the second feedback clock signal FBCLK2. Further, since the pull-up current source 321 is configured by a P-channel MOS transistor and the pull-down current source 322 is configured by a N-channel MOS transistor in the charge pump 223, there may occur an error in sizes between the pull-up current IUP and the pull-down current IDN in spite of size adjustment of the transistors when designed. Therefore, there should occur a phase error between the first internal clock signal ICLKD and the second feedback clock signal FBCLK2 even when the second delay locked loop 220 illustrated in FIG. 2 completes a delay-locking operation. The phase error may be represented by a following equation.

$$\Delta t2 = \Delta t_{MIS} + t_{RESET} * (1 - IUP/IDN)$$

In the above equation, "$\Delta t2$" may represent the phase error between the first internal clock signal ICLKD and the second feedback clock signal FBCLK2 when the second delay locked loop 220 is locked, "$\Delta t_{MIS}$" may represent the delay mismatch by the second phase detector 222 and "$t_{RESET}$" may represent the predetermined time when the up signal UP and the down signal DN are reset. In general, in order to improve "$\Delta t2$", the amount of the pull-up current IUP and the pull-down current IDN which are provided for the charge pump 223 to generate the delay control voltage VC may be adjusted. However, it may be difficult to implement high resolution by the scheme of adjusting the current amount of the charge pump 223 and the mismatch may occur again between the adjusted pull-up current IUP and pull-down current IDN. Therefore, it may be difficult to fundamentally resolve the phase error between the first internal clock signal ICLKD and the second feedback clock signal FBCLK2.

Figure 4:
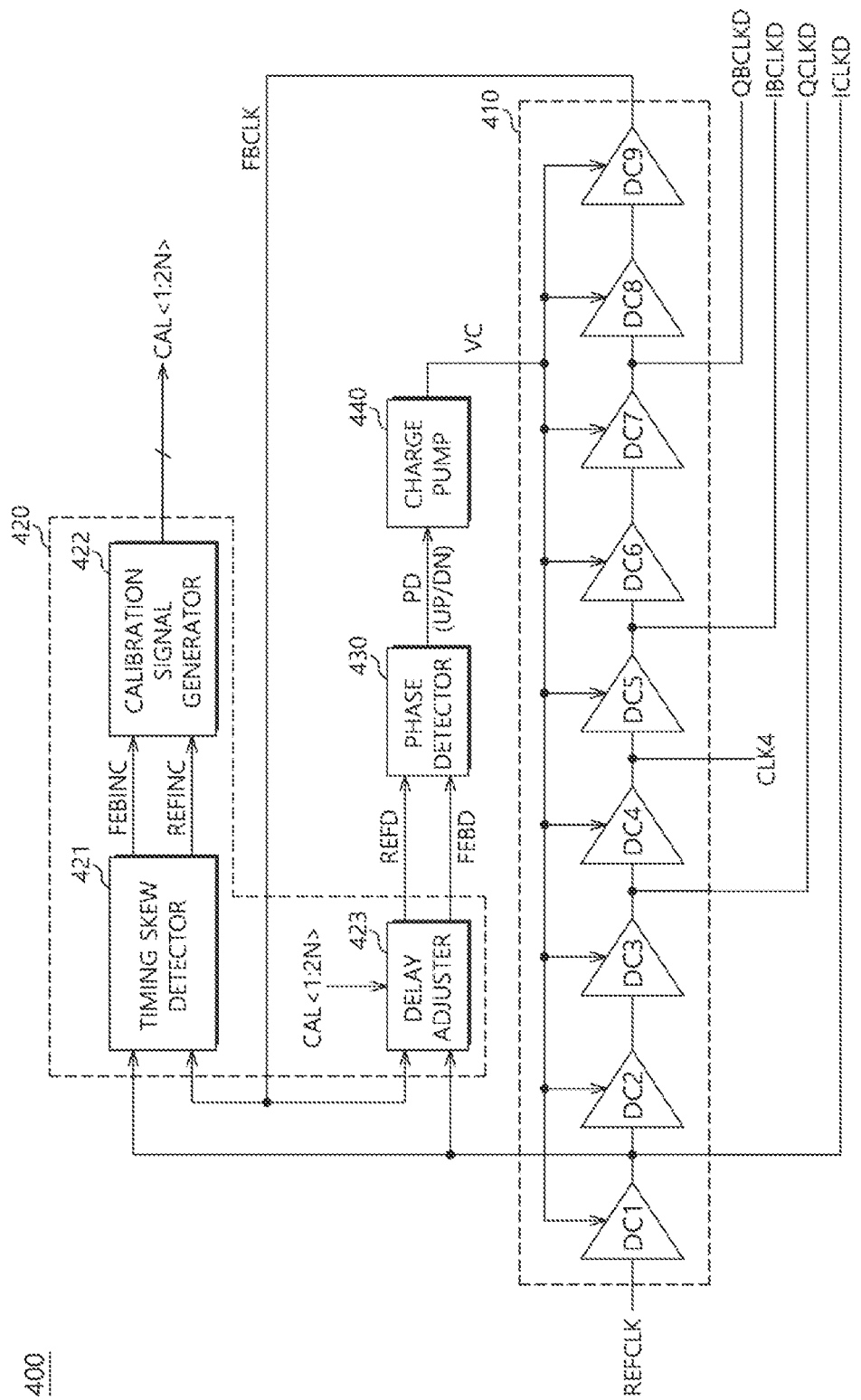
FIG. 4 is a diagram illustrating a configuration of an analog delay locked loop in accordance with an embodiment.

FIG. 4 is a diagram illustrating a configuration of an analog delay locked loop 400 in accordance with an embodiment. The analog delay locked loop 400 may be applied as the second delay locked loop 122 illustrated in FIG. 1. The analog delay locked loop 400 may replace the second delay locked loop 220 illustrated in FIG. 2. The analog delay locked loop 400 may include a delay line 410, a calibration circuit 420, a phase detector 430 and a charge pump 440. The delay line 410 receives the reference clock signal REFCLK and the delay control voltage VC. When the analog delay locked loop 400 replaces the second delay locked loop 220 illustrated in FIG. 2, the reference clock signal REFCLK may correspond to the delay locked clock signal CLKDLL. The delay line 410 may delay the reference clock signal REFCLK based on the delay control voltage VC to generate the plurality of delayed clock signals. The delay line 410 may output one among the plurality of delayed clock signals as the internal reference clock signal and may output another one among the plurality of delayed clock signals as the feedback clock signal FBCLK. The delay line 410 may generate four among the plurality of delayed clock signals, as the first internal clock signal ICLKD, the second internal clock signal QCLKD, the third internal clock signal IBCLKD and the fourth internal clock signal QBCLKD. The delay line 410 may provide the first internal clock signal ICLKD as the internal reference clock signal. The delay line 410 may include a plurality of delay cells DC1 to DC9 respectively configured to output the plurality of delayed clock signals. The configurations of the delay line 410 may be the same as the configurations of the second delay line 221 and thus redundant description about the same elements will be omitted.

The calibration circuit 420 may receive the first internal clock signal ICLKD and the feedback clock signal FBCLK. The calibration circuit 420 may generate a delayed reference clock signal REFD from the reference clock signal based on the phases of the first internal clock signal ICLKD and the feedback clock signal FBCLK. The calibration circuit 420 may generate a delayed feedback clock signal FEBD from the feedback clock signal FBCLK. The calibration circuit 420 may change the delay amount of the first internal clock signal ICLKD and the delay amount of the feedback clock signal FBCLK according to relative phases of the first internal clock signal ICLKD and the feedback clock signal FBCLK. The calibration circuit 420 may delay, for a longer time, a clock signal having a lagging phase to the other clock signal between the first internal clock signal ICLKD and the feedback clock signal FBCLK. For example, when the first internal clock signal ICLKD has a leading phase to the feedback clock signal FBCLK, the calibration circuit 420 may delay the first internal clock signal ICLKD for a first time to generate the delayed reference clock signal REFD and may delay the feedback clock signal FBCLK for a second time to generate the delayed feedback clock signal FEBD. The second time may be longer than the first time. For example, when the first internal clock signal ICLKD has a lagging phase to the feedback clock signal FBCLK, the calibration circuit 420 may delay the first internal clock signal ICLKD for the second time to generate the delayed reference clock signal REFD and may delay the feedback clock signal FBCLK for the first time to generate the delayed feedback clock signal FEBD.

The phase detector 430 may receive the delayed reference clock signal REFD and the delayed feedback clock signal FEBD. The phase detector 430 may detect the phases of the delayed reference clock signal REFD and the delayed feedback clock signal FEBD to generate a phase detection signal PD. The phase detection signal PD may include the up signal UP and the down signal DN. The charge pump 440 may generate the delay control voltage VC based on the phase detection signal PD. The phase detector 430 and the charge pump 440 may have the same configurations and may perform the same operations as the second phase detector 222 and the charge pump 223 illustrated in FIGS. 2 and 3. Redundant description about the same configurations will be omitted.

The calibration circuit 420 may include a timing skew detector 421, a calibration signal generator 422 and a delay adjuster 423. The timing skew detector 421 may detect phase difference between the first internal clock signal ICLKD and the feedback clock signal FBCLK. The timing skew detector 421 may detect the phase difference between the first internal clock signal ICLKD and the feedback clock signal FBCLK to generate a first phase adjustment signal FEBINC and a second phase adjustment signal REFINC. The timing skew detector 421 may detect the phase difference between the first internal clock signal ICLKD and the feedback clock signal FBCLK to generate a first skew detection signal and a second skew detection signal. The timing skew detector 421 may generate the first phase adjustment signal FEBINC and the second phase adjustment signal REFINC according to whether the logic levels of the first skew detection signal and the second skew detection signal stay kept for an time corresponding to at least double of a unit cycle. The time corresponding to at least double of the unit cycle may be a loop bandwidth of the calibration circuit 420 and may represent a period when the calibration circuit 420 is updated. The loop bandwidth of the calibration circuit 420 may be smaller than a loop bandwidth of the analog delay locked loop 400. The period when the calibration circuit 420 is updated may be greater than a period when the analog delay locked loop 400 is updated. In an embodiment, the loop bandwidth of the calibration circuit 420 may be set as three times of the unit cycle or greater. The unit cycle may be determined on the basis of the plurality of delayed clock signals generated from the delay line 410. The unit cycle will be described later.

The calibration signal generator 422 may receive the first phase adjustment signal FEBINC and the second phase adjustment signal REFINC to generate a calibration signal CAL<1:2N>. The calibration signal CAL<1:2N> may be a digital code signal having a plurality of bits. The calibration signal generator 422 may change a value of a part of the calibration signal CAL<1:2N> based on the first phase adjustment signal FEBINC. The calibration signal generator 422 may change a value of a remaining part of the calibration signal CAL<1:2N> based on the second phase adjustment signal REFINC. For example, the calibration signal CAL<1:2N> may have 2N number of bits. Here, N is an integer equal to or greater than 2. The calibration signal generator 422 may change a value of first to $N^{th}$ bits CAL<1:N> of the calibration signal CAL<1:2N> based on the first phase adjustment signal FEBINC. The calibration signal generator 422 may change a value of $(N+1)^{th}$ to $2N^{th}$ bits CAL<N+1:2N> of the calibration signal CAL<1:2N> based on the second phase adjustment signal REFINC. The calibration signal generator 422 may include configurations such as a decoding circuit, a shift register circuit and so forth such that the calibration signal generator 422 decodes the first phase adjustment signal FEBINC and the second phase adjustment signal REFINC and changes a value of the first to $2N^{th}$ bits CAL<1:2N> of the calibration signal CAL<1:2N> according to the result of the decoding.

The delay adjuster 423 may receive the calibration signal CAL<1:2N>. The delay adjuster 423 may delay the first internal clock signal ICLKD based on a part of the calibration signal CAL<1:2N> to generate the delayed reference clock signal REFD. The delay adjuster 423 may delay the feedback clock signal FBCLK based on a remaining part of the calibration signal CAL<1:2N> to generate the delayed feedback clock signal FEBD. The delay adjuster 423 may delay the first internal clock signal ICLKD by a predetermined amount based on the first to $N^{th}$ bits CAL<1:N> of the calibration signal CAL<1:2N> to generate the delayed reference clock signal REFD. The delay adjuster 423 may delay the feedback clock signal FBCLK by a predetermined amount based on the (N+1)th to $2N^{th}$ bits CAL<N+1:2N> of the calibration signal CAL<1:2N> to generate the delayed feedback clock signal FEBD.

Figure 5:
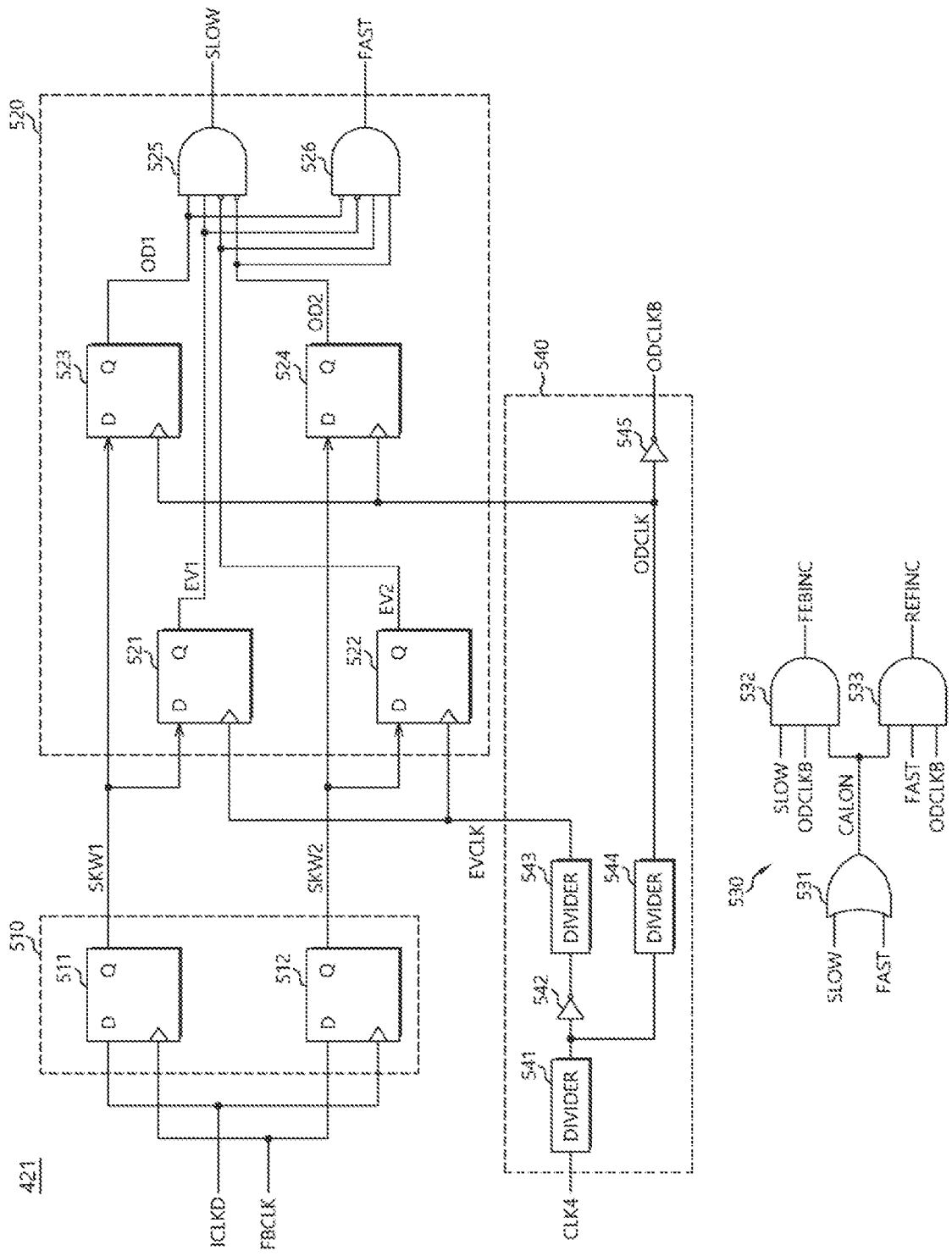
FIG. 5 is a diagram illustrating a configuration of a timing skew detector illustrated in FIG. 4.

FIG. 5 is a diagram illustrating a configuration of timing skew detector 421 illustrated in FIG. 4. Referring to FIG. 5, the timing skew detector 421 may include a skew detector 510, a filter 520 and a phase adjustment signal generator 530. The skew detector 510 may detect the phases of the first internal clock signal ICLKD and the feedback clock signal FBCLK to generate a first skew detection signal SKW1 and a second skew detection signal SKW2. The first skew detection signal SKW1 may include information on whether the first internal clock signal ICLKD has a leading phase or a lagging phase to the feedback clock signal FBCLK. The second skew detection signal SKW2 may include information on whether the feedback clock signal FBCLK has a leading phase or a lagging phase to the first internal clock signal ICLKD.

The filter 520 may receive the first skew detection signal SKW1 and the second skew detection signal SKW2. The filter 520 may generate a first phase information signal SLOW and a second phase information signal FAST based on the first skew detection signal SKW1 and the second skew detection signal SKW2. The first phase information signal SLOW may be enabled when the feedback clock signal FBCLK has a lagging phase to the first internal clock signal ICLKD. The second phase information signal FAST may be enabled with the feedback clock signal FBCLK has a leading phase to the first internal clock signal ICLKD. The filter 520 may define the loop bandwidth of the calibration circuit 420 based on one among the plurality of delayed clock signals. The filter 520 may generate the first phase information signal SLOW and the second phase information signal FAST based on whether the logic levels of the first skew detection signal SKW1 and the second skew detection signal SKW2 stay kept at the same logic level, for a time corresponding to the loop bandwidth.

The phase adjustment signal generator 530 may receive the first phase information signal SLOW and the second phase information signal FAST. The phase adjustment signal generator 530 may generate the first phase adjustment signal FEBINC based on the first phase information signal SLOW. The phase adjustment signal generator 530 may generate the second phase adjustment signal REFINC based on the second phase information signal FAST.

The skew detector 510 may include a first flip-flop 511 and a second flip-flop 512. Each of the first flip-flop 511 and the second flip-flop 512 may be a D flip-flop. The first flip-flop 511 may receive the first internal clock signal ICLKD at its input node D, may receive the feedback clock signal FBCLK at its clock node and may output the first skew detection signal SKW1 at its output node Q. The second flip-flop 512 may receive the feedback clock signal FBCLK at its input node D, may receive the first internal clock signal ICLKD at its clock node and may output the second skew detection signal SKW2 at its output node Q. In order to reduce a malfunction that can occur due to variation of setup times and hold times of the first flip-flop 511 and the second flip-flop 512, the skew detector 510 may detect a skew between phases of the first internal clock signal ICLKD and the feedback clock signal FBCLK in a dual mode.

The filter 520 may include a first flip-flop 521, a second flip-flop 522, a third flip-flop 523, a fourth flip-flop 524, a first gating circuit 525 and a second gating circuit 526. Each of the first to fourth flip-flops 521, 522, 523 and 524 may be a D flip-flop. The first flip-flop 521 may receive the first skew detection signal SKW1 at its input node D, may receive a first clock signal EVCLK at its clock node and may output a first even signal EV1 at its output node Q. The second flip-flop 522 may receive the second skew detection signal SKW2 at its input node D, may receive the first clock signal EVCLK at its clock node and may output a second even signal EV2 at its output node Q. The third flip-flop 523 may receive the first skew detection signal SKW1 at its input node D, may receive a second clock signal ODCLK at its clock node and may output a first odd signal OD1 at its output node Q. The second clock signal ODCLK may have a lagging phase to the first clock signal EVCLK. The fourth flip-flop 524 may receive the second skew detection signal SKW2 at its input node D, may receive the second clock signal ODCLK at its clock node and may output a second odd signal OD2 at its output node Q.

The first gating circuit 525 may receive the first even signal EV1, the first odd signal OD1, the second even signal EV2 and the second odd signal OD2. The first gating circuit 525 may perform an AND operation on the received signals to generate the first phase information signal SLOW. The first gating circuit 525 may include an AND gate. The first gating circuit 525 may receive the first even signal EV1, the first odd signal OD1, an inverted signal of the second even signal EV2 and an inverted signal of the second odd signal OD2 to generate the first phase information signal SLOW. The second gating circuit 526 may receive the first even signal EV1, the first odd signal OD1, the second even signal EV2 and the second odd signal OD2. The second gating circuit 526 may perform an AND operation on the received signal to generate the second phase information signal FAST. The second gating circuit 526 may include an AND gate. The second gating circuit 526 may receive an inverted signal of the first even signal EV1, an inverted signal of the first odd signal OD1, the second even signal EV2 and the second odd signal OD2 to generate the second phase information signal FAST. In order to reduce the loop bandwidth of the calibration circuit 420 and increase the update period of the calibration circuit 420, the filter 520 may further include an additional flip-flop. The additional flip-flop may receive a clock signal having a lagging phase to the second clock signal ODCLK. The gating circuits may be modified to further receive a signal output from the additional flip-flop.

The first gating circuit 525 may output, when the first even signal EV1 and the first odd signal OD1 are of a high logic level and the second even signal EV2 and the second odd signal OD2 are of a low logic level, the first phase information signal SLOW of a high logic level. The second gating circuit 526 may output, when the first even signal EV1 and the first odd signal OD1 are of a low logic level and the second even signal EV2 and the second odd signal OD2 are of a high logic level, the second phase information signal FAST of a high logic level. The first even signal EV1 and the second even signal EV2 may be generated in synchronization with the first clock signal EVCLK. The first odd signal OD1 and the second odd signal OD2 may be generated in synchronization with the second clock signal ODCLK. Therefore, the filter 520 may enable the first phase information signal SLOW and the second phase information signal FAST to a high logic level only when the logic levels of the first skew detection signal SKW1 and the second skew detection signal SKW2 are kept at the high logic level until transitions of the first clock signal EVCLK and the second clock signal ODCLK are generated. In general, a delay locked loop may cause a bang-bang jitter and thus an incorrect calibration operation may be performed in a case of generating phase information signal directly from the first skew detection signal SKW1 and the second skew detection signal SKW2. In accordance with an embodiment, a value of a calibration signal may change according to a phase information signal only when the logic levels of the first skew detection signal SKW1 and the second skew detection signal SKW2 are kept at a same logic level for a predetermined time. Therefore, a precise calibration operation may be performed.

The phase adjustment signal generator 530 may include a first gating circuit 531, a second gating circuit 532 and a third gating circuit 533. The first gating circuit 531 may receive the first phase information signal SLOW and the second phase information signal FAST to generate a calibration enable signal CALON. The first gating circuit 531 may perform an OR operation on the first phase information signal SLOW and the second phase information signal FAST to generate the calibration enable signal CALON. The first gating circuit 531 may include an OR gate. The first gating circuit 531 may enable, when at least one between the first phase information signal SLOW and the second phase information signal FAST is enabled to a high logic level, the calibration enable signal CALON to a high logic level. The second gating circuit 532 may receive the first phase information signal SLOW, the calibration enable signal CALON and a third clock signal ODCLKB. The third clock signal ODCLKB may have a lagging phase to the second clock signal ODCLK. The second gating circuit 532 may perform an AND operation on the first phase information signal SLOW, the calibration enable signal CALON and the third clock signal ODCLKB to generate the first phase adjustment signal FEBINC. The second gating circuit 532 may include an AND gate. The second gating circuit 532 may enable the first phase adjustment signal FEBINC to a high logic level when both of the first phase information signal SLOW and the calibration enable signal CALON are of a high logic level while the third clock signal ODCLKB is of a high logic level. The third gating circuit 533 may receive the second phase information signal FAST, the calibration enable signal CALON and the third clock signal ODCLKB. The third gating circuit 533 may perform an AND operation on the second phase information signal FAST, the calibration enable signal CALON and the third clock signal ODCLKB to generate the second phase adjustment signal REFINC. The third gating circuit 533 may include an AND gate. The third gating circuit 533 may enable the second phase adjustment signal REFINC to a high logic level when both of the second phase information signal FAST and the calibration enable signal CALON are of a high logic level while the third clock signal ODCLKB is of a high logic level.

The timing skew detector 421 may further include a control clock generator 540. The control clock generator 540 may receive one among the plurality of delayed clock signals generated from the voltage-controlled delay line 410 illustrated in FIG. 4. For example, the control clock generator 540 may receive the delayed clock signal CLK4 output from the fourth delay cell DC4 of the voltage-controlled delay line 410. The control clock generator 540 may generate the first clock signal EVCLK, the second clock signal ODCLK and the third clock signal ODCLKB from the delayed clock signal CLK4. The control clock generator 540 may include a first divider 541, a first inverter 542, a second divider 543, a third divider 544 and a second inverter 545. The first divider 541 may divide the delayed clock signal CLK4. The first inverter 542 may invert the output of the first divider 541. The second divider 543 may divide the output of the first inverter 542 to generate the first clock signal EVCLK. The third divider 544 may divide the output of the first divider 541 to generate the second clock signal ODCLK. The second inverter 545 may invert the second clock signal ODCLK to generate the third clock signal ODCLKB.

Figure 6:
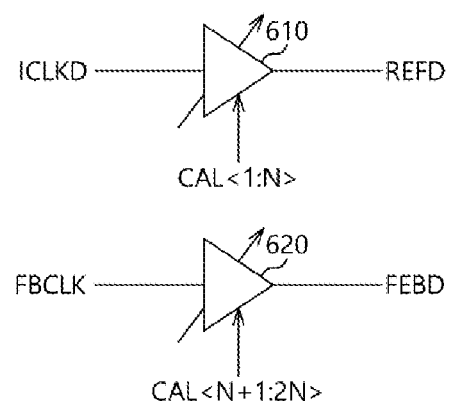
FIG. 6 is a diagram illustrating a configuration of a delay adjuster illustrated in FIG. 4.

FIG. 6 is a diagram illustrating a configuration of the delay adjuster 423 illustrated in FIG. 4. Referring to FIG. 6, the delay adjuster 423 may include a first variable delayer 610 and a second variable delayer 620. The first variable delayer 610 may receive the first internal clock signal ICLKD and the first to $N^{th}$ bits CAL<1:N> of the calibration signal CAL<1:2N> to generate the delayed reference clock signal REFD. A delay amount of the first variable delayer 610 may be set on the basis of the first to $N^{th}$ bits CAL<1:N> of the calibration signal CAL<1:2N>. The first variable delayer 610 may delay the first internal clock signal ICLKD by the set delay time to generate the delayed reference clock signal REFD. The second variable delayer 620 may receive the feedback clock signal FBCLK and the $(N+1)^{th}$ to $2N^{th}$ bits CAL<N+1:2N> of the calibration signal CAL<1:2N> to generate the delayed feedback clock signal FEBD. A delay amount of the second variable delayer 620 may be set on the basis of the $(N+1)^{th}$ to $2N^{th}$ bits CAL<N+1:2N> of the calibration signal CAL<1:2N>. The second variable delayer 620 may delay the feedback clock signal FBCLK by the set delay time to generate the delayed feedback clock signal FEBD.

Figure 7:
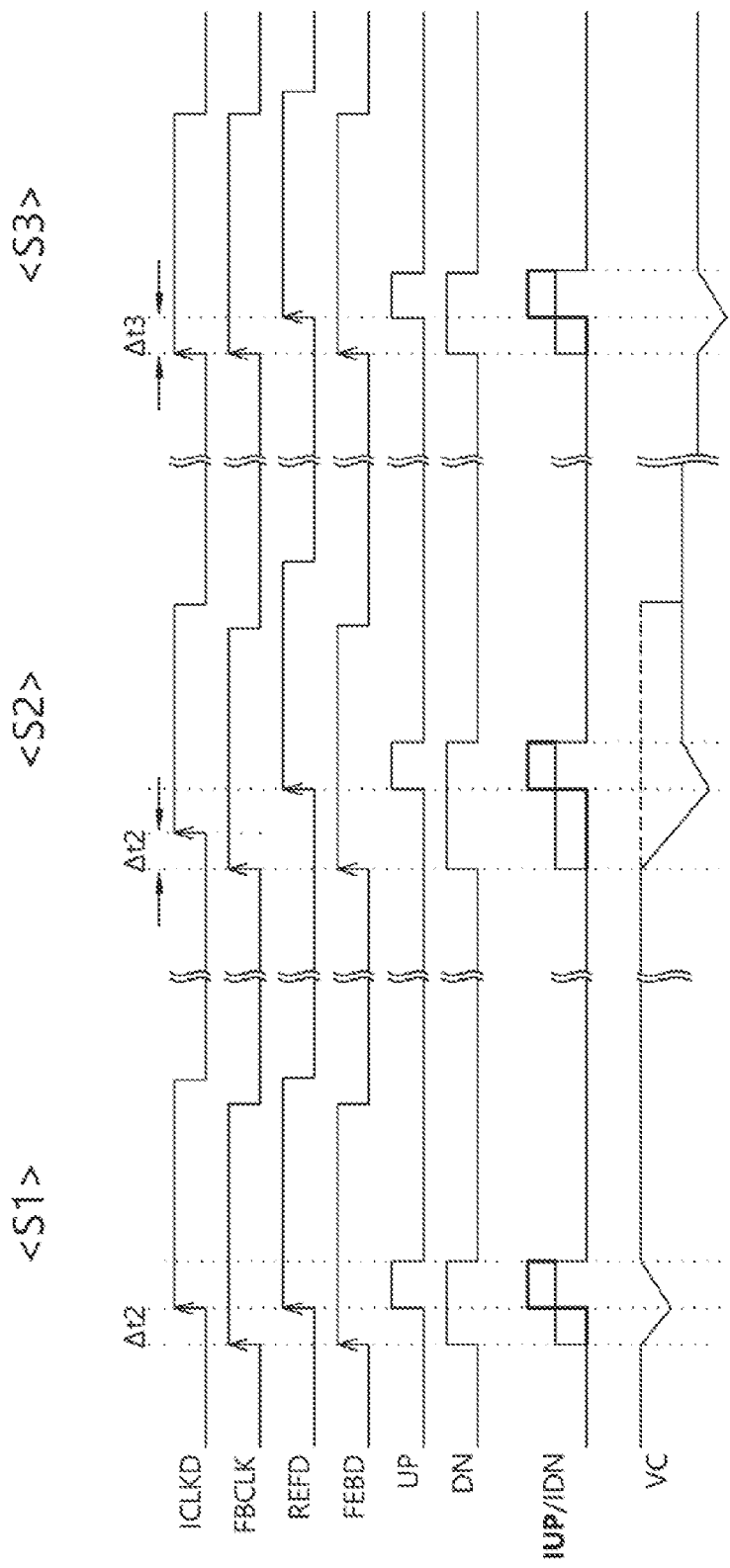
FIG. 7 is a timing diagram illustrating operations of a calibration circuit and an analog delay locked loop in accordance with an embodiment.

FIG. 7 is a timing diagram illustrating operations of the calibration circuit 420 and the analog delay locked loop 400 in accordance with an embodiment. Hereinafter, described with reference to FIGS. 3 to 6 will be the operations of the calibration circuit 420 and the analog delay locked loop 400. In S1, the skew detector 510 of the timing skew detector 421 may detect the phases of the first internal clock signal ICLKD and the feedback clock signal FBCLK to generate the first skew detection signal SKW1 and the second skew detection signal SKW2. As illustrated in FIG. 7, when the first internal clock signal ICLKD has a lagging phase to the feedback clock signal FBCLK due to the phase error "Δt2" caused by the phase detector 430 and the charge pump 440, the skew detector 510 may generate the first skew detection signal SKW1 having a low logic level and the second skew detection signal SKW2 having a high logic level. The calibration signal CAL<1:2N> may keep a default value before update. The delay adjuster 423 may delay the first internal clock signal ICLKD and the feedback clock signal FBCLK by the same time to generate the delayed reference clock signal REFD and the delayed feedback clock signal FEBD. The phase detector 430 may enable the down signal DN when the delayed feedback clock signal FEBD transitions from a low logic level to a high logic level. The phase detector 430 may enable the up signal UP when the first internal clock signal ICLKD transitions from a low logic level to a high logic level. The up signal UP and the down signal DN may stay enabled until reset. A pulse width of the down signal DN may be wider than a pulse width of the up signal UP. In an ideal case, the charge pump 440 should generate the delay control voltage VC having a lower level based on the up signal UP and the down signal DN. However, when the pull-up current IUP is greater than the pull-down current IDN due to the mismatch between the pull-up current IUP and the pull-down current IDN of the charge pump 440, there may occur a malfunction that the voltage level of the delay control voltage VC cannot lower and stays to a previous voltage level. Therefore, it is impossible, only by the phase detector 430 and the charge pump 440, to match the phases of the first internal clock signal ICLKD and the feedback clock signal FBCLK. When the logic levels of the first skew detection signal SKW1 and the second skew detection signal SKW2 are kept at a same logic level for a predetermined time, the filter 520 of the calibration circuit 420 may keep the first phase information signal SLOW disabled and may enable the second phase information signal FAST to a high logic level.

In S2, the phase adjustment signal generator 530 may enable the second phase adjustment signal REFINC according to the second phase information signal FAST. The calibration signal generator 422 may increase the value of the $(N+1)^{th}$ to $2N^{th}$ bits CAL<N+1:2N> of the calibration signal CAL<1:2N>. The delay adjuster 423 may delay the feedback clock signal FBCLK by a relatively longer time to generate the delayed feedback clock signal FEBD. The delay adjuster 423 may delay the first internal clock signal ICLKD by a relatively shorter time to generate the delayed reference clock signal REFD. Therefore, the phase difference between the delayed reference clock signal REFD and the delayed feedback clock signal FEBD may become greater than the phase difference between the first internal clock signal ICLKD and the feedback clock signal FBCLK. The delayed reference clock signal REFD may be further delayed than the delayed feedback clock signal FEBD by a calibrated phase "Δt3", which is set by a calibration operation. The phase detector 430 may enable the down signal DN when the delayed feedback clock signal FEBD transitions from a low logic level to a high logic level. The phase detector 430 may enable the up signal UP when the delayed reference clock signal REFD transitions from a low logic level to a high logic level. The up signal UP and the down signal DN may stay enabled until reset. The up signal UP may have the same pulse width as the up signal UP generated in S1. The down signal DN may have a greater pulse width than the down signal DN generated in S1. The charge pump 440 may pull-down the delay control voltage VC for a longer time according to the down signal DN. Therefore, the voltage level of the delay control voltage VC may lower even when the pull-up current IUP is greater than the pull-down current IDN.

In S3, when the voltage level of the delay control voltage VC lowers, the phased of the first internal clock signal ICLKD and the feedback clock signal FBCLK, which are generated from the delay line 410, may be matched. The delayed reference clock signal REFD and the delayed feedback clock signal FEBD may have lagging phases to the delayed reference clock signal REFD and the delayed feedback clock signal FEBD illustrated in S2. Therefore, the voltage level of the delay control voltage VC may become lower than the voltage level of the delay control voltage VC illustrated in S2. Since the phases of the first internal clock signal ICLKD and the feedback clock signal FBCLK are matched, the calibration circuit 420 may terminate the calibration operation and may keep the value of the calibration signal CAL<1:2N>. The delay adjuster 423 may further delay the first internal clock signal ICLKD with respect to the feedback clock signal FBCLK by the delay time, which is set by the calibration operation, to generate the delayed reference clock signal REFD. Therefore, the delayed reference clock signal REFD may have a lagging phase, by an amount of the calibrated phase "Δt3" that is set by the calibration operation, to the delayed feedback clock signal FEBD. The phase difference between the delayed reference clock signal REFD and the delayed feedback clock signal FEBD may compensate for the phase error "Δt2" caused by the local process variation of the phase detector 430 and the mismatch between pull-up current IUP and the pull-down current IDN of the charge pump 440. The delay control voltage VC generated from the charge pump 440 may keep having a specific level. Therefore, the analog delay locked loop 400 may generate the first internal clock signal ICLKD and the feedback clock signal FBCLK, of which the phases are matched by the calibration circuit 420.

Figure 8A:
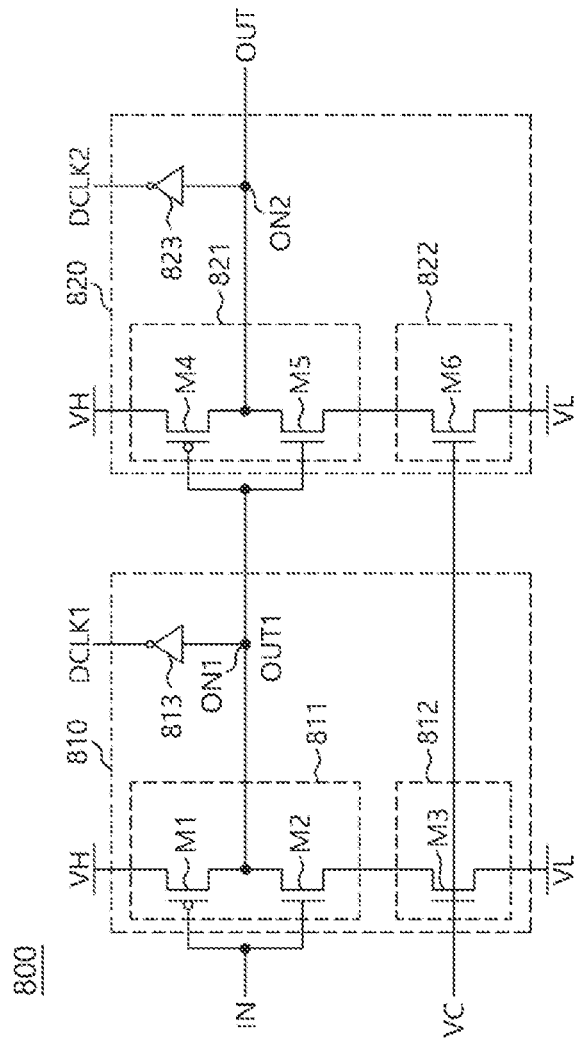
FIG. 8A is a diagram illustrating a configuration of a delay line in accordance with an embodiment.
Figure 8B:
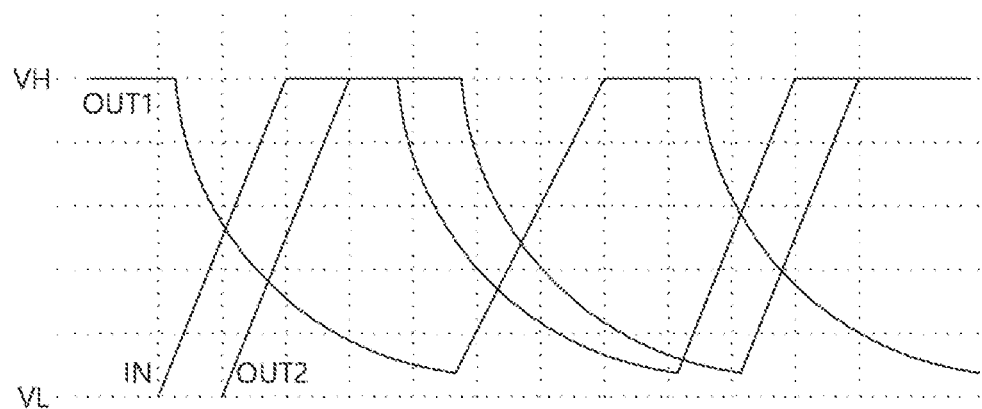
FIG. 8B is a timing diagram illustrating an operation of the delay line illustrated in FIG. 8A.

FIG. 8A is a diagram illustrating a configuration of a delay line 800 in accordance with an embodiment. FIG. 8B is a timing diagram illustrating an operation of the delay line 800 illustrated in FIG. 8A. The delay line 800 may be applied as a part of each of the second delay line 221 and the delay line 410 respectively illustrated in FIGS. 2 and 4. Referring to FIG. 8A, the delay line 800 may include a first delay cell 810 and a second delay cell 820. The first delay cell 810 may invert an input signal IN to generate a first output signal OUT1. The first delay cell 810 may inversion-drive the first output signal OUT1 to output a first delayed clock signal DCLK1. The second delay cell 820 may invert the first output signal OUT1 to generate a second output signal OUT2. The second delay cell 820 may inversion-drive the second output signal OUT2 to output a second delayed clock signal DCLK2. Pull-down driving force, with which the first delay cell 810 pulls down the first output signal OUT1 according to the input signal IN, may change based on the delay control voltage VC. When the pull-down driving force of the first delay cell 810 changes, a delay amount of the first delay cell 810 may change. Pull-down driving force, with which the second delay cell 820 pulls down the second output signal OUT2 according to the first output signal OUT1, may change based on the delay control voltage VC. When the pull-down driving force of the second delay cell 820 changes, a delay amount of the second delay cell 820 may change. In an embodiments, a voltage level outputted from the delay cell may be quickly changed and the delay amount of the delay cell may be decreased as the pull-down driving force of the delay cell is increased. The voltage level outputted from the delay cell may be slowly changed and the delay amount of the delay cell may be increased as the pull-down driving force of the delay cell is decreased.

The first delay cell 810 may include a first inverter 811 and a first current source 812. The first inverter 811 may receive the input signal IN and may invert the input signal IN to generate the first output signal OUT1. The first inverter 811 may be coupled between a node, from which the high voltage VH is provided, and a node, from which the low voltage VL is provided. The first inverter 811 may invert the input signal IN. The high voltage VH may have a higher voltage level than the low voltage VL. The first current source 812 may be coupled between the first inverter 811 and the node, from which the low voltage VL is provided. The first current source 812 may receive the delay control voltage VC. The first current source 812 may change the pull-down driving force of the first inverter 811 based on the delay control voltage VC to change the delay amount of the first delay cell 810. The first delay cell 810 may further include a second inverter 813. The second inverter 813 may inversion-drive the first output signal OUT1 to output the first delayed clock signal DCLK1.

The second delay cell 820 may include a third inverter 821 and a second current source 822. The third inverter 821 may receive the first output signal OUT1 and may invert the first output signal OUT1 to generate the second output signal OUT2. The third inverter 821 may be coupled between the node, from which the high voltage VH is provided, and the node, from which the low voltage VL is provided. The third inverter 821 may invert the first output signal OUT1. The second current source 822 may be coupled between the third inverter 821 and the node, from which the low voltage VL is provided. The second current source 822 may receive the delay control voltage VC. The second current source 822 may change the pull-down driving force of the third inverter 821 based on the delay control voltage VC to change the delay amount of the second delay cell 820. The second delay cell 820 may further include a fourth inverter 823. The fourth inverter 823 may inversion-drive the second output signal OUT2 to output the second delayed clock signal DCLK2.

The first inverter 811 may include a first transistor M1 and a second transistor M2. The first transistor M1 may be a P-channel MOS transistor. The second transistor M2 may be a N-channel MOS transistor. The first current source 812 may include a third transistor M3. The third transistor M3 may be a N-channel MOS transistor. The first transistor M1 may receive the input signal IN at its gate, may be coupled to the node, from which the high voltage VH is provided, at its source and may be coupled to a first output node ON1 at its drain. The first output signal OUT1 may be output through the first output node ON1. The second transistor M2 may receive the input signal IN at its gate and may be coupled to the first output node ON1 at its drain. The third transistor M3 may receive the delay control voltage VC at its gate, may be coupled at its drain to the source of the second transistor M2 and may be coupled to the node, from which the low voltage VL is provided, at its source. The third transistor M3 may change an amount of current flowing from the source of the second transistor M2 to the node, from which the low voltage VL is provided, based on the delay control voltage VC.

The third inverter 821 may include a fourth transistor M4 and a fifth transistor M5. The fourth transistor M4 may be a P-channel MOS transistor. The fifth transistor M5 may be a N-channel MOS transistor. The second current source 822 may include a sixth transistor M6. The sixth transistor M6 may be a N-channel MOS transistor. The fourth transistor M4 may receive the first output signal OUT1 at its gate, may be coupled to the node, from which the high voltage VH is provided, at its source and may be coupled to a second output node ON2 at its drain. The second output signal OUT2 may be output through the second output node ON2. The fifth transistor M5 may receive the first output signal OUT1 at its gate and may be coupled to the second output node ON2 at its drain. The sixth transistor M6 may receive the delay control voltage VC at its gate, may be coupled at its drain to the source of the fifth transistor M5 and may be coupled to the node, from which the low voltage VL is provided, at its source. The sixth transistor M6 may change an amount of current flowing from the source of the fifth transistor M5 to the node, from which the low voltage VL is provided, based on the delay control voltage VC.

The delay line 800 has an advantage that the delay amounts of the first delay cell 810 and the second delay cell 820 can change based on the delay control voltage VC, which is an analog signal, and thus the delay variation is reduced and the phase skew is reduced in spite of a high frequency of the input signal IN input to the delay line 800.

However, due to the characteristic of the N-channel MOS transistor that loss occurs in a threshold voltage and the voltage level variation that high boundary of the voltage level is increased, there is a problem that the first output signal OUT1 and the second output signal OUT2 cannot fully swing to the voltage level of the low voltage VL, as illustrated in FIG. 8B. When the first output signal OUT1 and the second output signal OUT2 cannot fully swing, a waveform of a final output signal becomes more distorted as a number of delay cells becomes greater and a precise output signal cannot be generated at a high-speed operation.

Figure 9A:
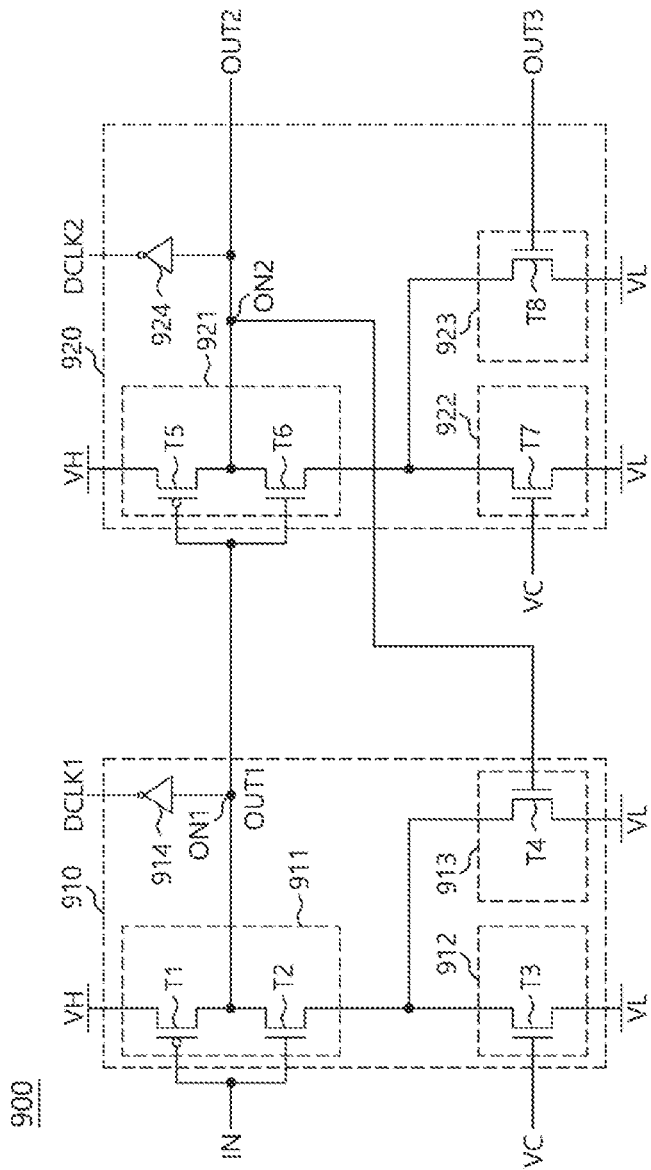
FIG. 9A is a diagram illustrating a configuration of a delay line in accordance with an embodiment.
Figure 9B:
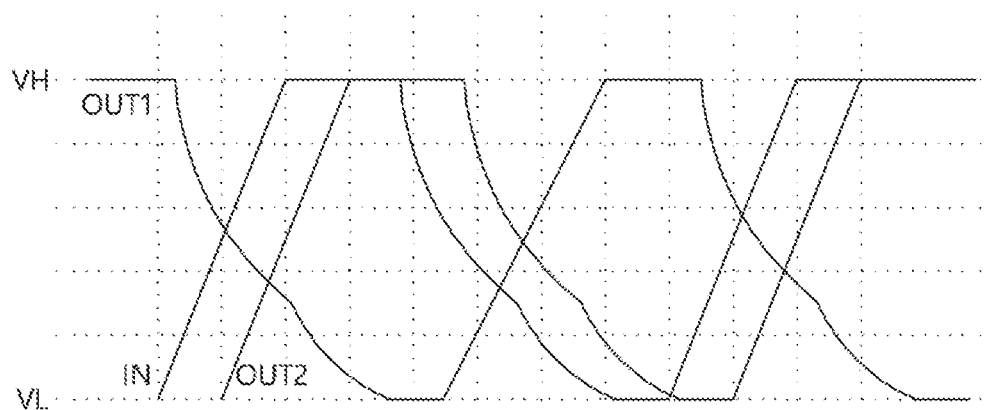
FIG. 9B is a timing diagram illustrating an operation of the delay line illustrated in FIG. 9A.

FIG. 9A is a diagram illustrating a configuration of a delay line 900 in accordance with an embodiment. FIG. 9B is a timing diagram illustrating an operation of the delay line 900 illustrated in FIG. 9A. The delay line 900 may be applied as a part of each of the second delay line 221 and the delay line 410 respectively illustrated in FIGS. 2 and 4. Referring to FIG. 9A, the delay line 900 may include a first delay cell 910 and a second delay cell 920. The first delay cell 910 may invert an input signal IN to generate a first output signal OUT1. The first delay cell 910 may inversion-drive the first output signal OUT1 to output a first delayed clock signal DCLK1. The second delay cell 920 may invert the first output signal OUT1 to generate a second output signal OUT2. The second delay cell 920 may inversion-drive the second output signal OUT2 to output a second delayed clock signal DCLK2. Pull-down driving force, with which the first delay cell 910 pulls down the first output signal OUT1 according to the input signal IN, may change based on the delay control voltage VC and the second output signal OUT2. When the pull-down driving force of the first delay cell 910 changes, a delay amount of the first delay cell 910 may change. Pull-down driving force, with which the second delay cell 920 pulls down the second output signal OUT2 according to the first output signal OUT1, may change based on the delay control voltage VC. When the pull-down driving force of the second delay cell 920 changes, a delay amount of the second delay cell 920 may change. In an embodiment, the second delay cell 920 may further receive an output signal OUT3 output from a subsequent delay cell, which is disposed subsequently to the second delay cell 920 and configured to receive the second output signal OUT2. The pull-down driving force and the delay amount of the second delay cell 920 may change based on the delay control voltage VC and the output signal OUT3 output from the subsequent delay cell.

The first delay cell 910 may include a first inverter 911, a first current source 912 and a first feedback current source 913. The first inverter 911 may receive the input signal IN and may invert the input signal IN to generate the first output signal OUT1. The first inverter 911 may be coupled between a node, from which the high voltage VH is provided, and a node, from which the low voltage VL is provided. The first inverter 911 may invert the input signal IN. The first current source 912 may be coupled between the first inverter 911 and the node, from which the low voltage VL is provided. The first current source 912 may receive the delay control voltage VC. The first current source 912 may change the pull-down driving force of the first inverter 911 based on the delay control voltage VC to change the delay amount of the first delay cell 910. The first feedback current source 913 may be coupled between the first inverter 911 and the node, from which the low voltage VL is provided. The first feedback current source 913 may receive the second output signal OUT2. The first feedback current source 913 may further change the pull-down driving force of the first inverter 911 based on the second output signal OUT2. The first delay cell 910 may further include a second inverter 914. The second inverter 914 may inversion-drive the first output signal OUT1 to output the first delayed clock signal DCLK1.

The second delay cell 920 may include a third inverter 921, a second current source 922 and a second feedback current source 923. The third inverter 921 may receive the first output signal OUT1 and may invert the first output signal OUT1 to generate the second output signal OUT2. The third inverter 921 may be coupled between the node, from which the high voltage VH is provided, and the node, from which the low voltage VL is provided. The third inverter 921 may invert the first output signal OUT1. The second current source 922 may be coupled between the third inverter 921 and the node, from which the low voltage VL is provided. The second current source 922 may receive the delay control voltage VC. The second current source 922 may change the pull-down driving force of the third inverter 921 based on the delay control voltage VC to change the delay amount of the second delay cell 920. The second feedback current source 923 may be coupled between the third inverter 921 and the node, from which the low voltage VL is provided. The second feedback current source 923 may receive the output signal OUT3 output from the subsequent delay cell. The second feedback current source 923 may further change the pull-down driving force of the third inverter 921 based on the output signal OUT3 output from the subsequent delay cell. The second delay cell 920 may further include a fourth inverter 924. The fourth inverter 924 may inversion-drive the second output signal OUT2 to output the second delayed clock signal DCLK2.

The first inverter 911 may include a first transistor T1 and a second transistor T2. The first transistor T1 may be a P-channel MOS transistor. The second transistor T2 may be a N-channel MOS transistor. The first current source 912 may include a third transistor T3. The third transistor T3 may be a N-channel MOS transistor. The first feedback current source 913 may include a fourth transistor T4. The fourth transistor T4 may be a N-channel MOS transistor. The first transistor T1 may receive the input signal IN at its gate, may be coupled to the node, from which the high voltage VH is provided, at its source and may be coupled to a first output node ON1 at its drain. The first output signal OUT1 may be output through the first output node ON1. The second transistor T2 may receive the input signal IN at its gate and may be coupled to the first output node ON1 at its drain. The third transistor T3 may receive the delay control voltage VC at its gate, may be coupled at its drain to the source of the second transistor T2 and may be coupled to the node, from which the low voltage VL is provided, at its source. The third transistor T3 may change an amount of current flowing from the source of the second transistor T2 to the node, from which the low voltage VL is provided, based on the delay control voltage VC. The fourth transistor T4 may receive the second output signal OUT2 at its gate, may be coupled at its drain to the source of the second transistor T2 and may be coupled to the node, from which the low voltage VL is provided, at its source. The fourth transistor T4 may further change the amount of current flowing from the source of the second transistor T2 to the node, from which the low voltage VL is provided, based on the second output signal OUT2.

The third inverter 921 may include a fifth transistor T5 and a sixth transistor T6. The fifth transistor T5 may be a P-channel MOS transistor. The sixth transistor T6 may be a N-channel MOS transistor. The second current source 922 may include a seventh transistor T7. The seventh transistor T7 may be a N-channel MOS transistor. The second feedback current source 923 may include an eighth transistor T8. The eighth transistor T8 may be a N-channel MOS transistor. The fifth transistor T5 may receive the first output signal OUT1 at its gate, may be coupled to the node, from which the high voltage VH is provided, at its source and may be coupled to a second output node ON2 at its drain. The second output signal OUT2 may be output through the second output node ON2. The sixth transistor T6 may receive the first output signal OUT1 at its gate and may be coupled to the second output node ON2 at its drain. The seventh transistor T7 may receive the delay control voltage VC at its gate, may be coupled at its drain to the source of the sixth transistor T6 and may be coupled to the node, from which the low voltage VL is provided, at its source. The seventh transistor T7 may change an amount of current flowing from the source of the sixth transistor T6 to the node, from which the low voltage VL is provided, based on the delay control voltage VC. The eighth transistor T8 may receive at its gate the output signal OUT3 output from the subsequent delay cell, may be coupled at its drain to the source of the sixth transistor T6 and may be coupled to the node, from which the low voltage VL is provided, at its source. The eighth transistor T8 may further change the amount of current flowing from the source of the sixth transistor T6 to the node, from which the low voltage VL is provided, based on the output signal OUT3 output from the subsequent delay cell.

The delay line 900 may solve the problem, as illustrated in FIG. 8B, that the first output signal OUT1 and the second output signal OUT2 cannot fully swing. The first feedback current source 913 and the second feedback current source 923 may further increase the amounts of current respectively flowing from the first inverter 911 and the third inverter 921 to the node, from which the low voltage VL is provided, to further change the pull-down driving force of the first delay cell 910 and the second delay cell 920. As illustrated in FIG. 9B, the first feedback current source 913 and the second feedback current source 923 may respectively receive the output signals fed-back from the delay cells disposed subsequently thereto and thus may further change the pull-down driving force of the first delay cell 910 and the second delay cell 920. Therefore, the first feedback current source 913 and the second feedback current source 923 may allow the first output signal OUT1 and the second output signal OUT2 to fully swing to the level of the low voltage VL. The first feedback current source 913 and the second feedback current source 923 may operate after the logic level of the fed-back output signal transitions. Therefore, the first feedback current source 913 and the second feedback current source 923 may pull-down the first output signal OUT1 and the second output signal OUT2 to the level of the low voltage VL but the delay amounts of the delay cell 910 and the second delay cell 920 might not substantially change.

Figure 10A:
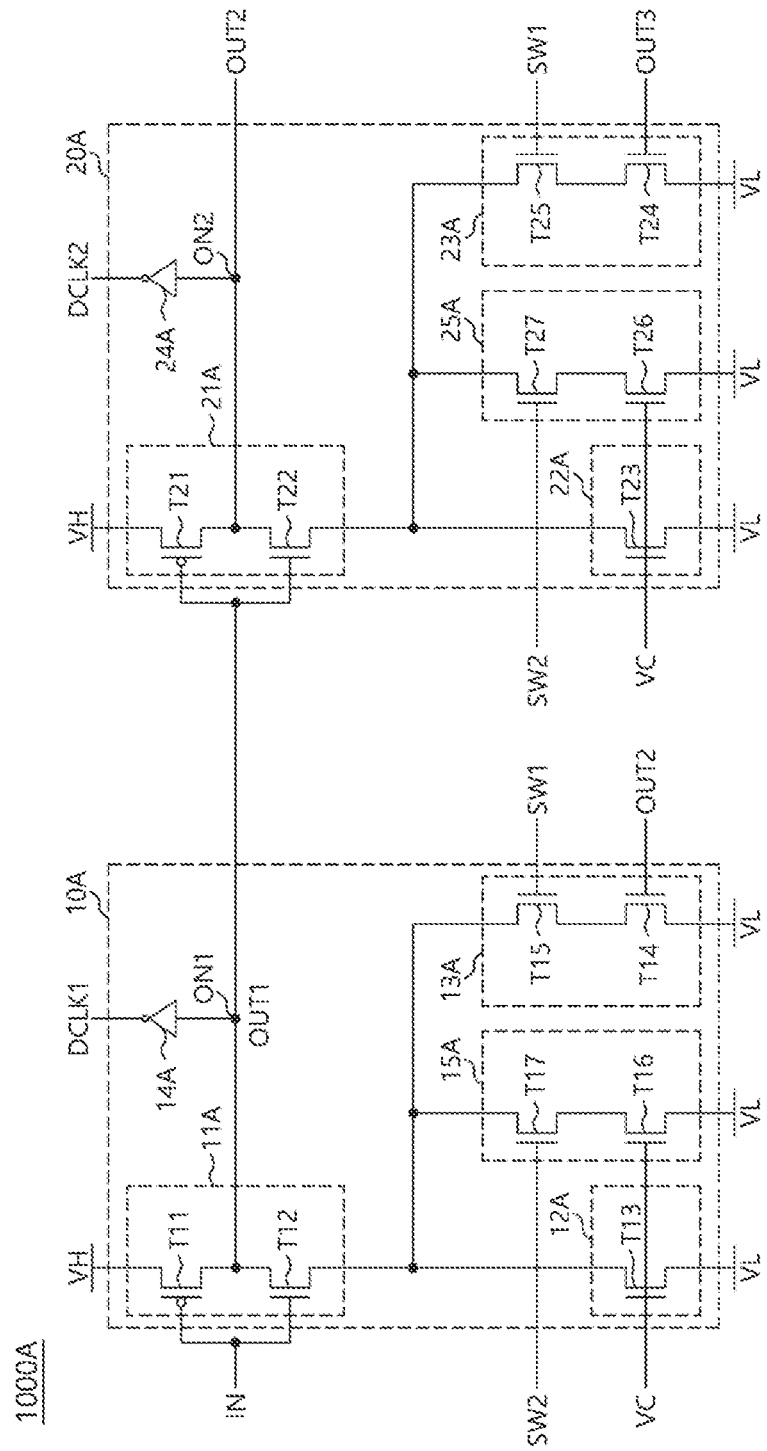
FIGS. 10A, 10B, and 10C are diagrams illustrating configurations of delay lines in accordance with an embodiment.
Figure 10B:
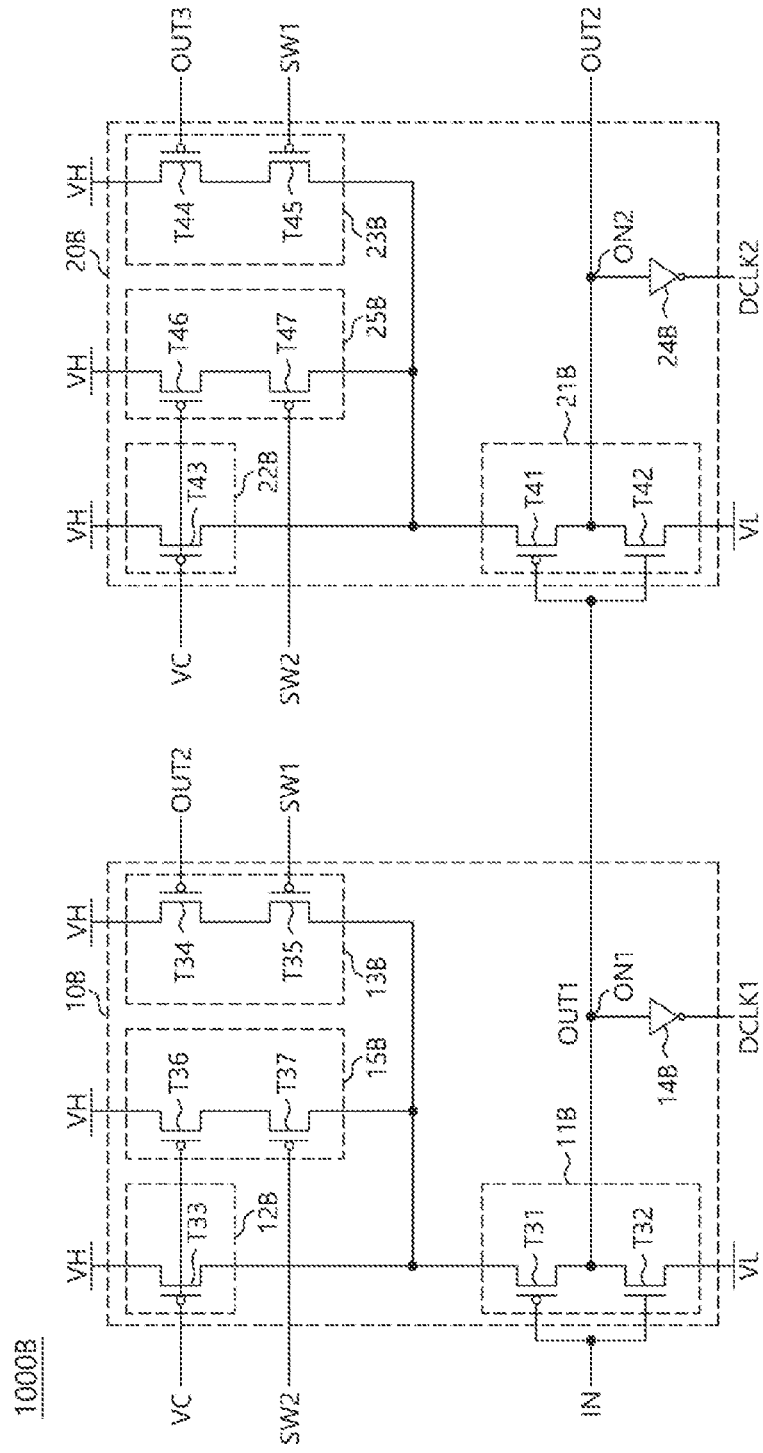
Figure 10C:
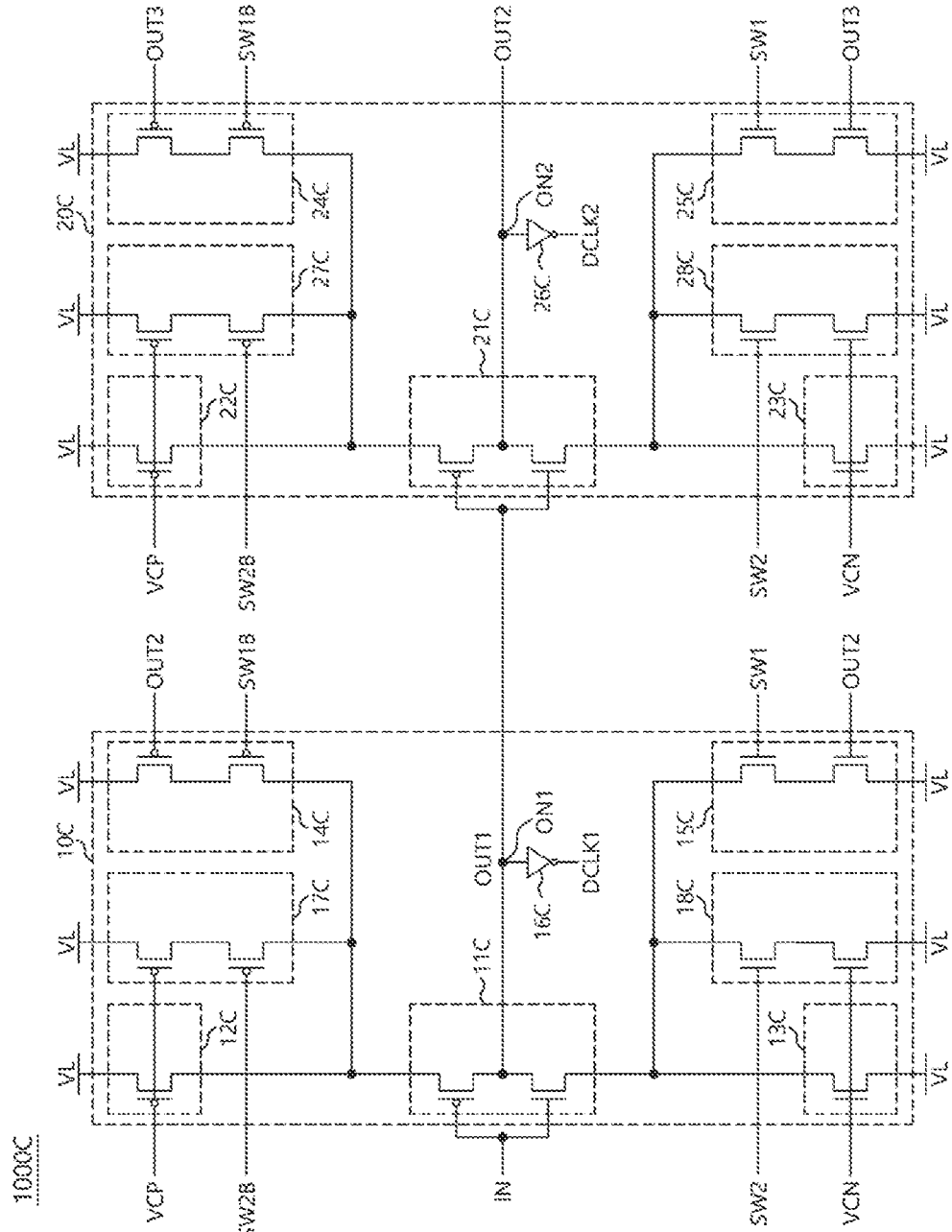

FIGS. 10A to 10C are diagrams illustrating configurations of delay lines 1000A, 1000B and 1000C in accordance with an embodiment. Each of the delay lines 1000A, 1000B and 1000C may be applied as a part of each of the second delay line 221 and the delay line 410 respectively illustrated in FIGS. 2 and 4. Referring to FIG. 10A, the delay line 1000A may include a first delay cell 10A and a second delay cell 20A. The first delay cell 10A may invert an input signal IN to generate a first output signal OUT1. The first delay cell 10A may inversion-drive the first output signal OUT1 to output a first delayed clock signal DCLK1. The second delay cell 20A may invert the first output signal OUT1 to generate a second output signal OUT2. The second delay cell 20A may inversion-drive the second output signal OUT2 to output a second delayed clock signal DCLK2. Pull-down driving force, with which the first delay cell 10A pulls down the first output signal OUT1 according to the input signal IN, may change based on the delay control voltage VC and the second output signal OUT2. Pull-down driving force, with which the second delay cell 20A pulls down the second output signal OUT2 according to the first output signal OUT1, may change based on the delay control voltage VC and an output signal OUT3 output from a subsequent delay cell, which is disposed subsequently to the second delay cell 20A and configured to receive the second output signal OUT2.

The first delay cell 10A may include a first inverter 11A, a first current source 12A and a first feedback current source 13A. The first inverter 11A may receive the input signal IN and may invert the input signal IN to generate the first output signal OUT1. The first inverter 11A may be coupled between a node, from which the high voltage VH is provided, and a node, from which the low voltage VL is provided. The first inverter 11A may invert the input signal IN. The first current source 12A may be coupled between the first inverter 11A and the node, from which the low voltage VL is provided. The first current source 12A may receive the delay control voltage VC. The first current source 12A may change the pull-down driving force of the first inverter 11A based on the delay control voltage VC to change the delay amount of the first delay cell 10A. The first feedback current source 13A may be coupled between the first inverter 11A and the node, from which the low voltage VL is provided. The first feedback current source 13A may receive the second output signal OUT2. The first feedback current source 13A may further change the pull-down driving force of the first inverter 11A based on the second output signal OUT2. In an embodiment, the first feedback current source 13A may further receive a first switching signal SW1. The first feedback current source 13A may be selectively coupled to the first inverter 11A according to the first switching signal SW1. The first delay cell 10A may further include a second inverter 14A. The second inverter 14A may inversion-drive the first output signal OUT1 to output the first delayed clock signal DCLK1.

In an embodiment, the first delay cell 10A may further include a first auxiliary current source 15A. The first auxiliary current source 15A may be coupled between the first inverter 11A and the node, from which the low voltage VL is provided. The first auxiliary current source 15A may receive the delay control voltage VC. The first auxiliary current source 15A may further change the pull-down driving force of the first inverter 11A based on the delay control voltage VC. In an embodiment, the first auxiliary current source 15A may further receive a second switching signal SW2. The first auxiliary current source 15A may be selectively coupled to the first inverter 11A according to the second switching signal SW2.

The second delay cell 20A may include a third inverter 21A, a second current source 22A and a second feedback current source 23A. The third inverter 21A may receive the first output signal OUT1 and may invert the first output signal OUT1 to generate the second output signal OUT2. The third inverter 21A may be coupled between the node, from which the high voltage VH is provided, and the node, from which the low voltage VL is provided. The third inverter 21A may invert the first output signal OUT1. The second current source 22A may be coupled between the third inverter 21A and the node, from which the low voltage VL is provided. The second current source 22A may receive the delay control voltage VC. The second current source 22A may change the pull-down driving force of the third inverter 21A based on the delay control voltage VC to change the delay amount of the second delay cell 20A. The second feedback current source 23A may be coupled between the third inverter 21A and the node, from which the low voltage VL is provided. The second feedback current source 23A may receive the output signal OUT3 output from the subsequent delay cell. The second feedback current source 23A may further change the pull-down driving force of the third inverter 21A based on the output signal OUT3 output from the subsequent delay cell. In an embodiment, the second feedback current source 23A may further receive the first switching signal SW1. The second feedback current source 23A may be selectively coupled to the third inverter 21A according to the first switching signal SW1. The second delay cell 20A may further include a fourth inverter 24A. The fourth inverter 24A may inversion-drive the second output signal OUT2 to output the second delayed clock signal DCLK2.

In an embodiment, the second delay cell 20A may further include a second auxiliary current source 25A. The second auxiliary current source 25A may be coupled between the third inverter 21A and the node, from which the low voltage VL is provided. The second auxiliary current source 25A may receive the delay control voltage VC. The second auxiliary current source 25A may further change the pull-down driving force of the third inverter 21A based on the delay control voltage VC. In an embodiment, the second auxiliary current source 25A may further receive the second switching signal SW2. The second auxiliary current source 25A may be selectively coupled to the third inverter 21A according to the second switching signal SW2.

The first inverter 11A may include a first transistor T11 and a second transistor T12. The first transistor T11 may be a P-channel MOS transistor. The second transistor T12 may be a N-channel MOS transistor. The first current source 12A may include a third transistor T13. The third transistor T13 may be a N-channel MOS transistor. The first feedback current source 13A may include a fourth transistor T14 and a fifth transistor T15. Each of the fourth transistor T14 and the fifth transistor T15 may be a N-channel MOS transistor. The first auxiliary current source 15A may include a sixth transistor T16 and a seventh transistor T17. Each of the sixth transistor T16 and the seventh transistor T17 may be a N-channel MOS transistor. The first transistor T11 may receive the input signal IN at its gate, may be coupled to the node, from which the high voltage VH is provided, at its source and may be coupled to a first output node ON1 at its drain. The first output signal OUT1 may be output through the first output node ON1. The second transistor T12 may receive the input signal IN at its gate and may be coupled to the first output node ON1 at its drain. The third transistor T13 may receive the delay control voltage VC at its gate, may be coupled at its drain to the source of the second transistor T12 and may be coupled to the node, from which the low voltage VL is provided, at its source. The third transistor T13 may change an amount of current flowing from the source of the second transistor T12 to the node, from which the low voltage VL is provided, based on the delay control voltage VC. The fourth transistor T14 may receive the second output signal OUT2 at its gate and may be coupled to the node, from which the low voltage VL is provided, at its source. The fifth transistor T15 may receive the first switching signal SW1 at its gate, may be coupled at its drain to the source of the second transistor T12 and may be coupled at its source to the drain of the fourth transistor T14. The fourth transistor T14 may further change the amount of current flowing from the source of the second transistor T12 to the node, from which the low voltage VL is provided, based on the second output signal OUT2. The fifth transistor T15 may selectively couple the fourth transistor T14 to the source of the second transistor T12 based on the first switching signal SW1. The sixth transistor T16 may receive the delay control voltage VC at its gate and may be coupled to the node, from which the low voltage VL is provided, at its source. The seventh transistor T17 may receive the second switching signal SW2 at its gate, may be coupled at its drain to the source of the second transistor T12 and may be coupled at its source to the drain of the sixth transistor T16. The sixth transistor T16 may further change the amount of current flowing from the source of the second transistor T12 to the node, from which the low voltage VL is provided, based on the delay control voltage VC. The seventh transistor T17 may selectively couple the sixth transistor T16 to the source of the second transistor T12 based on the second switching signal SW2.

The third inverter 21A may include a first transistor T21 and a second transistor T22. The first transistor T21 may be a P-channel MOS transistor. The second transistor T22 may be a N-channel MOS transistor. The second current source 22A may include a third transistor T23. The third transistor T23 may be a N-channel MOS transistor. The second feedback current source 23A may include a fourth transistor T24 and a fifth transistor T25. Each of the fourth transistor T24 and the fifth transistor T25 may be a N-channel MOS transistor. The second auxiliary current source 25A may include a sixth transistor T26 and a seventh transistor T27. Each of the sixth transistor T26 and the seventh transistor T27 may be a N-channel MOS transistor. The first transistor T21 may receive the first output signal OUT1 at its gate, may be coupled to the node, from which the high voltage VH is provided, at its source and may be coupled to a second output node ON2 at its drain. The second output signal OUT2 may be output through the second output node ON2. The second transistor T22 may receive the first output signal OUT1 at its gate and may be coupled to the second output node ON2 at its drain. The third transistor T23 may receive the delay control voltage VC at its gate, may be coupled at its drain to the source of the second transistor T22 and may be coupled to the node, from which the low voltage VL is provided, at its source. The third transistor T23 may change an amount of current flowing from the source of the second transistor T22 to the node, from which the low voltage VL is provided, based on the delay control voltage VC. The fourth transistor T24 may receive at its gate the output signal OUT3 output from the subsequent delay cell and may be coupled to the node, from which the low voltage VL is provided, at its source. The fifth transistor T25 may receive the first switching signal SW1 at its gate, may be coupled at its drain to the source of the second transistor T22 and may be coupled at its source to the drain of the fourth transistor T24. The fourth transistor T24 may further change the amount of current flowing from the source of the second transistor T22 to the node, from which the low voltage VL is provided, based on the output signal OUT3 output from the subsequent delay cell. The fifth transistor T25 may selectively couple the fourth transistor T24 to the source of the second transistor T22 based on the first switching signal SW1. The sixth transistor T26 may receive the delay control voltage VC at its gate and may be coupled to the node, from which the low voltage VL is provided, at its source. The seventh transistor T27 may receive the second switching signal SW2 at its gate, may be coupled at its drain to the source of the second transistor T22 and may be coupled at its source to the drain of the sixth transistor T26. The sixth transistor T26 may further change the amount of current flowing from the source of the second transistor T22 to the node, from which the low voltage VL is provided, based on the delay control voltage VC. The seventh transistor T27 may selectively couple the sixth transistor T26 to the source of the second transistor T22 based on the second switching signal SW2.

Referring to FIG. 10B, the delay line 1000B may include a first delay cell 10B and a second delay cell 20B. The first delay cell 10B may invert an input signal IN to generate a first output signal OUT1. The first delay cell 10B may inversion-drive the first output signal OUT1 to output a first delayed clock signal DCLK1. The second delay cell 20B may invert the first output signal OUT1 to generate a second output signal OUT2. The second delay cell 20B may inversion-drive the second output signal OUT2 to output a second delayed clock signal DCLK2. Pull-up driving force, with which the first delay cell 10B pulls up the first output signal OUT1 according to the input signal IN, may change based on the delay control voltage VC and the second output signal OUT2. Pull-up driving force, with which the second delay cell 20B pulls up the second output signal OUT2 according to the first output signal OUT1, may change based on the delay control voltage VC and an output signal OUT3 output from a subsequent delay cell, which is disposed subsequently to the second delay cell 20B and configured to receive the second output signal OUT2. In an embodiments, a voltage level outputted from the delay cell may be quickly changed and the delay amount of the delay cell may be decreased as the pull-up driving force of the delay cell is increased. The voltage level outputted from the delay cell may be slowly changed and the delay amount of the delay cell may be increased as the pull-up driving force of the delay cell is decreased.

The first delay cell 10B may include a first inverter 11B, a first current source 12B and a first feedback current source 13B. The first inverter 11B may receive the input signal IN and may invert the input signal IN to generate the first output signal OUT1. The first inverter 11B may be coupled between a node, from which the high voltage VH is provided, and a node, from which the low voltage VL is provided. The first inverter 11B may invert the input signal IN. The first current source 12B may be coupled between the first inverter 11B and the node, from which the high voltage VH is provided. The first current source 12B may receive the delay control voltage VC. The first current source 12B may change the pull-up driving force of the first inverter 11B based on the delay control voltage VC to change the delay amount of the first delay cell 10B. The first feedback current source 13B may be coupled between the first inverter 11B and the node, from which the high voltage VH is provided. The first feedback current source 13B may receive the second output signal OUT2. The first feedback current source 13B may further change the pull-up driving force of the first inverter 11B based on the second output signal OUT2. In an embodiment, the first feedback current source 13B may further receive a first switching signal SW1. The first feedback current source 13B may be selectively coupled to the first inverter 11B according to the first switching signal SW1. The first delay cell 10B may further include a second inverter 14B. The second inverter 14B may inversion-drive the first output signal OUT1 to output the first delayed clock signal DCLK1.

In an embodiment, the first delay cell 10B may further include a first auxiliary current source 15B. The first auxiliary current source 15B may be coupled between the first inverter 11B and the node, from which the high voltage VH is provided. The first auxiliary current source 15B may receive the delay control voltage VC. The first auxiliary current source 15B may further change the pull-up driving force of the first inverter 11B based on the delay control voltage VC. In an embodiment, the first auxiliary current source 15B may further receive a second switching signal SW2. The first auxiliary current source 15B may be selectively coupled to the first inverter 11B according to the second switching signal SW2.

The second delay cell 20B may include a third inverter 21B, a second current source 22B and a second feedback current source 23B. The third inverter 21B may receive the first output signal OUT1 and may invert the first output signal OUT1 to generate the second output signal OUT2. The third inverter 21B may be coupled between the node, from which the high voltage VH is provided, and the node, from which the low voltage VL is provided. The third inverter 21B may invert the first output signal OUT1. The second current source 22B may be coupled between the third inverter 21B and the node, from which the high voltage VH is provided. The second current source 22B may receive the delay control voltage VC. The second current source 22B may change the pull-up driving force of the third inverter 21B based on the delay control voltage VC to change the delay amount of the second delay cell 20B. The second feedback current source 23B may be coupled between the third inverter 21B and the node, from which the high voltage VH is provided. The second feedback current source 23B may receive the output signal OUT3 output from the subsequent delay cell. The second feedback current source 23B may further change the pull-up driving force of the third inverter 21B based on the output signal OUT3 output from the subsequent delay cell. In an embodiment, the second feedback current source 23B may further receive the first switching signal SW1. The second feedback current source 23B may be selectively coupled to the third inverter 21B according to the first switching signal SW1. The second delay cell 20B may further include a fourth inverter 24B. The fourth inverter 24B may inversion-drive the second output signal OUT2 to output the second delayed clock signal DCLK2.

In an embodiment, the second delay cell 20B may further include a second auxiliary current source 25B. The second auxiliary current source 25B may be coupled between the third inverter 21B and the node, from which the high voltage VH is provided. The second auxiliary current source 25B may receive the delay control voltage VC. The second auxiliary current source 25B may further change the pull-up driving force of the third inverter 21B based on the delay control voltage VC. In an embodiment, the second auxiliary current source 25B may further receive the second switching signal SW2. The second auxiliary current source 25B may be selectively coupled to the third inverter 21B according to the second switching signal SW2.

The first inverter 11B may include a first transistor T31 and a second transistor T32. The first transistor T31 may be a P-channel MOS transistor. The second transistor T32 may be a N-channel MOS transistor. The first current source 12B may include a third transistor T33. The third transistor T33 may be a P-channel MOS transistor. The first feedback current source 13B may include a fourth transistor T34 and a fifth transistor T35. Each of the fourth transistor T34 and the fifth transistor T35 may be a P-channel MOS transistor. The first auxiliary current source 15B may include a sixth transistor T36 and a seventh transistor T37. Each of the sixth transistor T36 and the seventh transistor T37 may be a P-channel MOS transistor. The first transistor T31 may receive the input signal IN at its gate, may be coupled to the node, from which the high voltage VH is provided, at its source and may be coupled to a first output node ON1 at its drain. The first output signal OUT1 may be output through the first output node ON1. The second transistor T32 may receive the input signal IN at its gate and may be coupled to the first output node ON1 at its drain. The third transistor T33 may receive the delay control voltage VC at its gate, may be coupled to the node, from which the high voltage VH is provided, at its source and may be coupled at its drain to the source of the first transistor T31. The third transistor T33 may change an amount of current flowing from the node, from which the high voltage VH is provided, to the source of the first transistor T31 based on the delay control voltage VC. The fourth transistor T34 may receive the second output signal OUT2 at its gate and may be coupled to the node, from which the high voltage VH is provided, at its source. The fifth transistor T35 may receive the first switching signal SW1 at its gate, may be coupled at its source to the drain of the fourth transistor T34 and may be coupled at its drain to the source of the first transistor T31. The fourth transistor T34 may further change the amount of current flowing from the node, from which the high voltage VH is provided, to the source of the first transistor T31 based on the second output signal OUT2. The fifth transistor T35 may selectively couple the fourth transistor T34 to the source of the first transistor T31 based on the first switching signal SW1. The sixth transistor T36 may receive the delay control voltage VC at its gate and may be coupled to the node, from which the high voltage VH is provided, at its source. The seventh transistor T37 may receive the second switching signal SW2 at its gate, may be coupled at its source to the drain of the sixth transistor T36 and may be coupled at its drain to the source of the first transistor T31. The sixth transistor T36 may further change the amount of current flowing from the node, from which the high voltage VH is provided, to the source of the first transistor T31 based on the delay control voltage VC. The seventh transistor T37 may selectively couple the sixth transistor T36 to the source of the first transistor T31 based on the second switching signal SW2.

The third inverter 21B may include a first transistor T41 and a second transistor T42. The first transistor T41 may be a P-channel MOS transistor. The second transistor T42 may be a N-channel MOS transistor. The second current source 22B may include a third transistor T43. The third transistor T43 may be a P-channel MOS transistor. The second feedback current source 23B may include a fourth transistor T44 and a fifth transistor T45. Each of the fourth transistor T44 and the fifth transistor T45 may be a P-channel MOS transistor. The second auxiliary current source 25B may include a sixth transistor T46 and a seventh transistor T47. Each of the sixth transistor T46 and the seventh transistor T47 may be a P-channel MOS transistor. The first transistor T41 may receive the first output signal OUT1 at its gate, may be coupled to the node, from which the high voltage VH is provided, at its source and may be coupled to a second output node ON2 at its drain. The second output signal OUT2 may be output through the second output node ON2. The second transistor T42 may receive the first output signal OUT1 at its gate and may be coupled to the second output node ON2 at its drain. The third transistor T43 may receive the delay control voltage VC at its gate, may be coupled to the node, from which the high voltage VH is provided, at its source and may be coupled at its drain to the source of the first transistor T41. The third transistor T43 may change an amount of current flowing from the node, from which the high voltage VH is provided, to the source of the first transistor T41 based on the delay control voltage VC. The fourth transistor T44 may receive at its gate the output signal OUT3 output from the subsequent delay cell and may be coupled to the node, from which the high voltage VH is provided, at its source. The fifth transistor T45 may receive the first switching signal SW1 at its gate, may be coupled at its source to the drain of the fourth transistor T44 and may be coupled at its drain to the source of the first transistor T41. The fourth transistor T44 may further change the amount of current flowing from the node, from which the high voltage VH is provided, to the source of the first transistor T41 based on the second output signal OUT2. The fifth transistor T45 may selectively couple the fourth transistor T44 to the source of the first transistor T41 based on the first switching signal SW1. The sixth transistor T46 may receive the delay control voltage VC at its gate and may be coupled to the node, from which the high voltage VH is provided, at its source. The seventh transistor T47 may receive the second switching signal SW2 at its gate, may be coupled at its source to the drain of the sixth transistor T46 and may be coupled at its drain to the source of the first transistor T41. The sixth transistor T46 may further change the amount of current flowing from the node, from which the high voltage VH is provided, to the source of the first transistor T41 based on the delay control voltage VC. The seventh transistor T47 may selectively couple the sixth transistor T46 to the source of the first transistor T41 based on the second switching signal SW2.

Referring to FIG. 10C, the delay line 1000C may include a first delay cell 10C and a second delay cell 20C. The first delay cell 10C may invert an input signal IN to generate a first output signal OUT1. The first delay cell 10C may inversion-drive the first output signal OUT1 to output a first delayed clock signal DCLK1. The second delay cell 20C may invert the first output signal OUT1 to generate a second output signal OUT2. The second delay cell 20C may inversion-drive the second output signal OUT2 to output a second delayed clock signal DCLK2. Pull-up driving force, with which the first delay cell 10C pulls up the first output signal OUT1 according to the input signal IN, may change based on a pull-up delay control voltage VCP and the second output signal OUT2. Pull-down driving force, with which the first delay cell 10C pulls down the first output signal OUT1 according to the input signal IN, may change based on a pull-down delay control voltage VCN and the second output signal OUT2. Pull-up driving force, with which the second delay cell 20C pulls up the second output signal OUT2 according to the first output signal OUT1, may change based on the pull-up delay control voltage VCP and an output signal OUT3 output from a subsequent delay cell, which is disposed subsequently to the second delay cell 20C and configured to receive the second output signal OUT2. Pull-down driving force, with which the second delay cell 20C pulls down the second output signal OUT2 according to the first output signal OUT1, may change based on the pull-down delay control voltage VCN and an output signal OUT3 output from the subsequent delay cell. The first delay cell 10C may include a first inverter 11C, a first current source 12C, a second current source 13C, a first feedback current source 14C and a second feedback current source 15C. The first delay cell 10C may further include a second inverter 16C, a first auxiliary current source 17C and a second auxiliary current source 18C. The second delay cell 20C may include a third inverter 22C, a third current source 22C, a fourth current source 23C, a third feedback current source 24C and a fourth feedback current source 25C. The second delay cell 20C may further include a fourth inverter 26C, a third auxiliary current source 27C and a fourth auxiliary current source 28C. The delay line 1000C may be configured by consolidating the configurations of the delay lines 1000A and 1000B respectively illustrated in FIGS. 10A and 10B.

The first inverter 11C may receive the input signal IN and may invert the input signal IN to generate the first output signal OUT1. The first current source 12C may be coupled between the first inverter 11C and the node, from which the high voltage VH is provided. The first current source 12C may receive the pull-up delay control voltage VCP. The first current source 12C may change the pull-up driving force of the first inverter 11C based on the pull-up delay control voltage VCP to change the delay amount of the first delay cell 10C. The second current source 13C may be coupled between the first inverter 11C and the node, from which the low voltage VL is provided. The second current source 13C may receive the pull-down delay control voltage VCN. The second current source 13C may change the pull-down driving force of the first inverter 11C based on the pull-down delay control voltage VCN to change the delay amount of the first delay cell 10C. The first feedback current source 14C may be coupled between the first inverter 11C and the node, from which the high voltage VH is provided. The first feedback current source 14C may receive the second output signal OUT2. The first feedback current source 14C may further change the pull-up driving force of the first inverter 11C based on the second output signal OUT2. In an embodiment, the first feedback current source 14C may further receive a complementary signal SW1B of a first switching signal SW1. The first feedback current source 14C may be selectively coupled to the first inverter 11C according to the complementary signal SW1B. The second feedback current source 15C may receive the second output signal OUT2. The second feedback current source 15C may be coupled between the first inverter 11C and the node, from which the low voltage VL is provided. The second feedback current source 15C may further change the pull-down driving force of the first inverter 11C based on the second output signal OUT2. In an embodiment, the second feedback current source 15C may further receive the first switching signal SW1. The second feedback current source 15C may be selectively coupled to the first inverter 11C according to the first switching signal SW1. The second inverter 16C may inversion-drive the first output signal OUT1 to output the first delayed clock signal DCLK1. The first auxiliary current source 17C may be coupled between the first inverter 11C and the node, from which the high voltage VH is provided. The first auxiliary current source 17C may receive the pull-up delay control voltage VCP. The first auxiliary current source 17C may further change the pull-up driving force of the first inverter 11C based on the pull-up delay control voltage VCP. In an embodiment, the first auxiliary current source 17C may further receive a complementary signal SW2B of a second switching signal SW2. The first auxiliary current source 17C may be selectively coupled to the first inverter 11C according to the complementary signal SW2B. The second auxiliary current source 18C may be coupled between the first inverter 11C and the node, from which the low voltage VL is provided. The second auxiliary current source 18C may receive the pull-down delay control voltage VCN. The second auxiliary current source 18C may further change the pull-down driving force of the first inverter 11C based on the pull-down delay control voltage VCN. In an embodiment, the second auxiliary current source 18C may further receive the second switching signal SW2. The second auxiliary current source 18C may be selectively coupled to the first inverter 11C according to the second switching signal SW2.

The third inverter 21C may receive the first output signal OUT1 and may invert the first output signal OUT1 to generate the second output signal OUT2. The third current source 22C may be coupled between the second inverter 21C and the node, from which the high voltage VH is provided. The third current source 22C may receive the pull-up delay control voltage VCP. The third current source 22C may change the pull-up driving force of the second inverter 21C based on the pull-up delay control voltage VCP to change the delay amount of the second delay cell 20C. The fourth current source 23C may be coupled between the third inverter 21C and the node, from which the low voltage VL is provided. The fourth current source 23C may receive the pull-down delay control voltage VCN. The fourth current source 23C may change the pull-down driving force of the third inverter 21C based on the pull-down delay control voltage VCN to change the delay amount of the second delay cell 20C. The third feedback current source 24C may be coupled between the third inverter 21C and the node, from which the high voltage VH is provided. The third feedback current source 24C may receive the output signal OUT3 output from the subsequent delay cell. The third feedback current source 24C may further change the pull-up driving force of the third inverter 21C based on the output signal OUT3 output from the subsequent delay cell. In an embodiment, the third feedback current source 24C may further receive the complementary signal SW1B of the first switching signal SW1. The third feedback current source 24C may be selectively coupled to the third inverter 21C according to the complementary signal SW1B. The fourth feedback current source 25C may receive the output signal OUT3 output from the subsequent delay cell. The fourth feedback current source 25C may be coupled between the third inverter 21C and the node, from which the low voltage VL is provided. The fourth feedback current source 25C may further change the pull-down driving force of the third inverter 21C based on the output signal OUT3 output from the subsequent delay cell. In an embodiment, the fourth feedback current source 25C may further receive the first switching signal SW1. The fourth feedback current source 25C may be selectively coupled to the third inverter 21C according to the first switching signal SW1. The fourth inverter 26C may inversion-drive the second output signal OUT2 to output the second delayed clock signal DCLK2. The third auxiliary current source 27C may be coupled between the third inverter 21C and the node, from which the high voltage VH is provided. The third auxiliary current source 27C may receive the pull-up delay control voltage VCP. The third auxiliary current source 27C may further change the pull-up driving force of the third inverter 21C based on the pull-up delay control voltage VCP. In an embodiment, the third auxiliary current source 27C may further receive the complementary signal SW2B of the second switching signal SW2. The third auxiliary current source 27C may be selectively coupled to the third inverter 21C according to the complementary signal SW2B. The fourth auxiliary current source 28C may be coupled between the third inverter 21C and the node, from which the low voltage VL is provided. The fourth auxiliary current source 28C may receive the pull-down delay control voltage VCN. The fourth auxiliary current source 28C may further change the pull-down driving force of the third inverter 21C based on the pull-down delay control voltage VCN. In an embodiment, the fourth auxiliary current source 28C may further receive the second switching signal SW2. The fourth auxiliary current source 28C may be selectively coupled to the third inverter 21C according to the second switching signal SW2.

Figure 11:
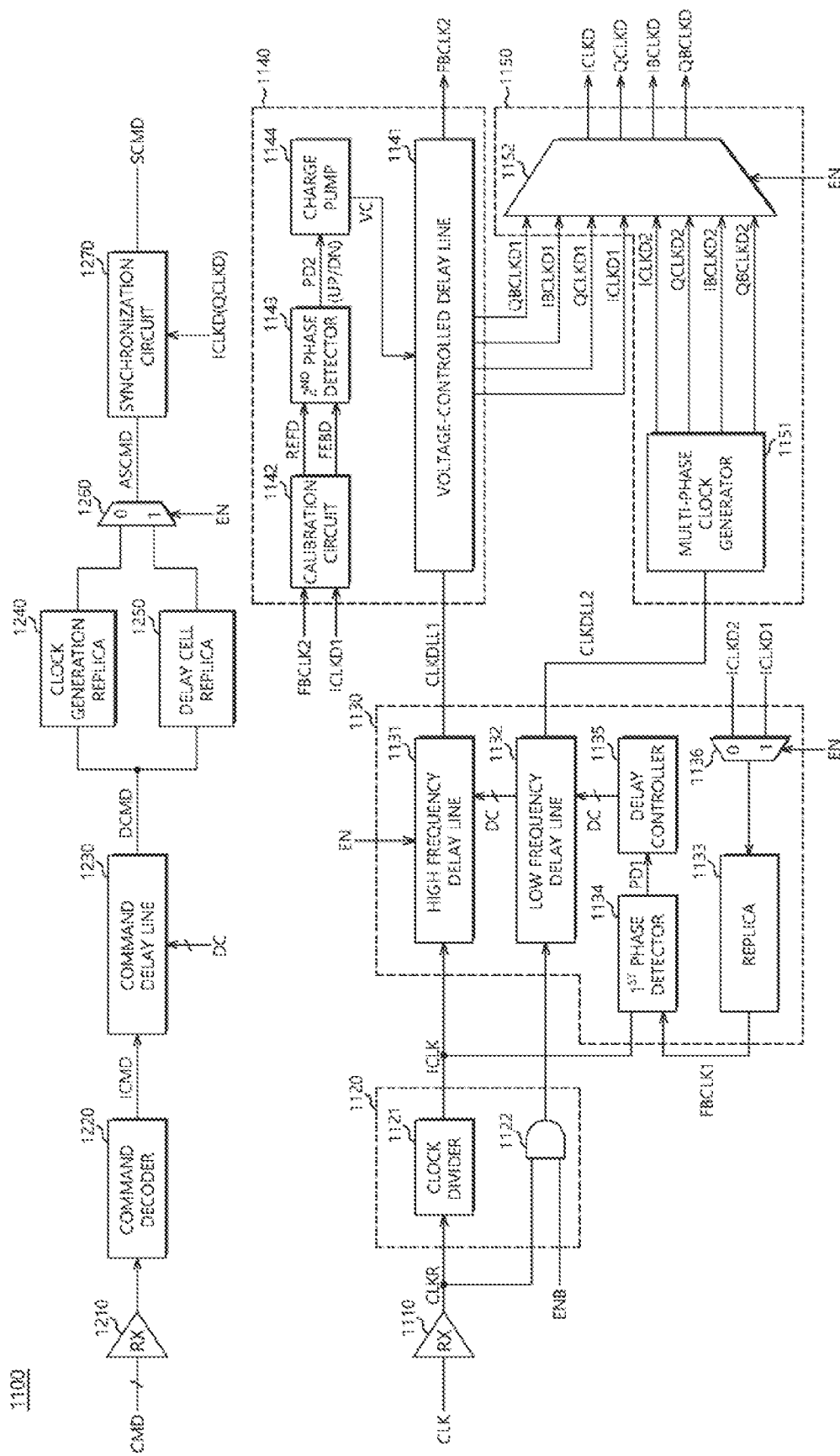
FIG. 11 is a diagram illustrating a configuration of a semiconductor apparatus in accordance with an embodiment.

FIG. 11 is a diagram illustrating a configuration of a semiconductor apparatus 1100 in accordance with an embodiment. Referring to FIG. 11, the semiconductor apparatus 1100 may receive a clock signal CLK and may perform a delay-locking operation on the clock signal CLK to generate a plurality of internal clock signals. The semiconductor apparatus 1100 may include a delay locked loop circuit in order to generate the plurality of internal clock signals from the clock signal CLK. The semiconductor apparatus 1100 may include a clock receiver 1110, a division circuit 1120, a first delay locked loop 1130, a second delay locked loop 1140 and a clock generation circuit 1150. The clock receiver 1110 may receive the clock signal CLK provided from an external of the semiconductor apparatus 1100. The clock receiver 1110 may buffer the clock signal CLK to output a buffered clock signal CLKR. The division circuit 1120 may receive the buffered clock signal CLKR and a frequency information signal EN. The frequency information signal EN may have information about whether the semiconductor apparatus 1100 operates with a relatively high frequency or with a relatively low frequency. For example, when the semiconductor apparatus 1100 operates with a high frequency, the frequency information signal EN may be enabled. For example, when the semiconductor apparatus 1100 operates with a low frequency lower than the high frequency, the frequency information signal EN may be disabled. The division circuit 1120 may receive the buffered clock signal CLKR and may divide the buffered clock signal CLKR to generate a divided clock signal ICLK. The division circuit 1120 may provide the divided clock signal ICLK as a reference clock signal. The division circuit 1120 may selectively output the buffered clock signal CLKR based on the frequency information signal EN. For example, the division circuit 1120 may output, when the frequency information signal EN is disabled, the first delay locked loop 1130 with the divided clock signal ICLK together with the buffered clock signal CLKR.

The first delay locked loop 1130 may be a digital delay locked loop including at least one digitally controlled delay line. The first delay locked loop 1130 may receive the reference clock signal, the frequency information signal EN, a first output clock signal ICLKD1 and a second output clock signal ICLKD2. The first delay locked loop 1130 may perform a delay-locking operation based on the reference clock signal and one signal selected on the basis of the frequency information signal EN between the first output clock signal ICLKD1 and the second output clock signal ICLKD2. The first delay locked loop 1130 may receive, as the reference clock signal, the divided clock signal ICLK generated from the division circuit 1120. The first delay locked loop 1130 may delay the reference clock signal to generate a first delay locked clock signal CLKDLL1. The first delay locked loop 1130 may delay the buffered clock signal CLKR to generate a second delay locked clock signal CLKDLL2. When the frequency information signal EN is enabled, the first delay locked loop 1130 may perform a delay-locking operation based on the first output clock signal ICLKD1 and the divided clock signal ICLK and may delay the divided clock signal ICLK to generate the first delay locked clock signal CLKDLL1. When the frequency information signal EN is disabled, the first delay locked loop 1130 may perform a delay-locking operation based on the second output clock signal ICLKD2 and the divided clock signal ICLK and may delay the buffered clock signal CLKR to generate the second delay locked clock signal CLKDLL2.

The second delay locked loop 1140 may be an analog delay locked loop including a voltage-controlled delay line. The second delay locked loop 1140 may receive the first delay locked clock signal CLKDLL1 to generate the first output clock signal ICLKD1. The second delay locked loop 1140 may perform a delay-locking operation on the first delay locked clock signal CLKDLL1 based on the first delay locked clock signal CLKDLL1 and the first output clock signal ICLKD1 to generate the first output clock signal ICLKD1. The second delay locked loop 1140 may delay the first delay locked clock signal CLKDLL1 to generate a first set of plural output clock signals ICLKD1, QCLKD1, IBCLKD1 and QBCLKD1. One among the first set of plural output clock signals ICLKD1, QCLKD1, IBCLKD1 and QBCLKD1 may be provided as the first output clock signal ICLKD1.

The clock generation circuit 1150 may receive the second delay locked clock signal CLKDLL2. The clock generation circuit 1150 may generate the second output clock signal ICLKD2 based on the second delay locked clock signal CLKDLL2. The clock generation circuit 1150 may generate, from the second delay locked clock signal CLKDLL2, a second set of plural output clock signals ICLKD2, QCLKD2, IBCLKD2 and QBCLKD2. One among the second set of plural output clock signals ICLKD2, QCLKD2, IBCLKD2 and QBCLKD2 may be provided as the second output clock signal ICLKD2. The clock generation circuit 1150 may further receive the frequency information signal EN. Based on the frequency information signal EN, the clock generation circuit 1150 may output, as a plurality of internal clock signals ICLKD, QCLKD, IBCLKD and QBCLKD, one between the first set of plural output clock signals ICLKD1, QCLKD1, IBCLKD1 and QBCLKD1 and the second set of plural output clock signals ICLKD2, QCLKD2, IBCLKD2 and QBCLKD2. When the frequency information signal EN is enabled, the clock generation circuit 1150 may output the first set of plural output clock signals ICLKD1, QCLKD1, IBCLKD1 and QBCLKD1 as the plurality of internal clock signals ICLKD, QCLKD, IBCLKD and QBCLKD. When the frequency information signal EN is disabled, the clock generation circuit 1150 may output the second set of plural output clock signals ICLKD2, QCLKD2, IBCLKD2 and QBCLKD2 as the plurality of internal clock signals ICLKD, QCLKD, IBCLKD and QBCLKD.

When the semiconductor apparatus 1100 operates with a high frequency, the frequency information signal EN may be enabled and a delay-locking operation may be performed through the first delay locked loop 1130 and the second delay locked loop 1140. The division circuit 1120 may divide the buffered clock signal CLKR to output the divided clock signal ICLK as the reference clock signal. The first delay locked loop 1130 may perform a delay-locking operation based on the divided clock signal ICLK and the first output clock signal ICLKD1 to generate the first delay locked clock signal CLKDLL1. When the delay-locking operation of the first delay locked loop 1130 is completed, the second delay locked loop 1140 may perform a delay-locking operation on the first delay locked clock signal CLKDLL1 provided from the first delay locked loop 1130. The second delay locked loop 1140 may perform a delay-locking operation on the first delay locked clock signal CLKDLL1 to generate the first set of plural output clock signals ICLKD1, QCLKD1, IBCLKD1 and QBCLKD1. The clock generation circuit 1150 may output, as the plurality of internal clock signals ICLKD, QCLKD, IBCLKD and QBCLKD, the first set of plural output clock signals ICLKD1, QCLKD1, IBCLKD1 and QBCLKD1, which are output from the second delay locked loop 1140.

When the semiconductor apparatus 1100 operates with a low frequency, the frequency information signal EN may be disabled and a delay-locking operation may be performed through the first delay locked loop 1130. The division circuit 1120 may output the divided clock signal ICLK as the reference clock signal and may output the buffered clock signal CLKR together with the divided clock signal ICLK. The first delay locked loop 1130 may perform a delay-locking operation based on the divided clock signal ICLK and the second output clock signal ICLKD2 and may delay the buffered clock signal CLKR to generate the second delay locked clock signal CLKDLL2. When the delay-locking operation of the first delay locked loop 1130 is completed, the clock generation circuit 1150 may receive the second delay locked clock signal CLKDLL2 from the first delay locked loop 1130. The clock generation circuit 1150 may generate the second set of plural output clock signals ICLKD2, QCLKD2, IBCLKD2 and QBCLKD2 based on the second delay locked clock signal CLKDLL2. The clock generation circuit 1150 may output the second set of plural output clock signals ICLKD2, QCLKD2, IBCLKD2 and QBCLKD2 as the plurality of internal clock signals ICLKD, QCLKD, IBCLKD and QBCLKD.

The division circuit 1120 may include a clock divider 1121 and a gating circuit 1122. The clock divider 1121 may receive the buffered clock signal CLKR and may divide the buffered clock signal CLKR. For example, the clock divider 1121 may divide the buffered clock signal CLKR by two to generate four divided clock signals. The clock divider 1121 may output, as the reference clock signal, one among the four divided clock signals. For example, the clock divider 1121 may output, as the reference clock signal, one divided clock signal ICLK, which has a phase corresponding to a phase of the buffered clock signal CLKR among the four divided clock signals. The gating circuit 1122 may selectively output the buffered clock signal CLKR based on the frequency information signal EN. The gating circuit 1122 may receive the buffered clock signal CLKR and a complementary signal ENB of the frequency information signal EN. The gating circuit 1122 may gate the buffered clock signal CLKR by the complementary signal ENB of the frequency information signal EN. The gating circuit 1122 may include an AND gate. When the frequency information signal EN is disabled or the complementary signal ENB of the frequency information signal EN is enabled, the gating circuit 1122 may output the buffered clock signal CLKR to the first delay locked loop 1130.

The first delay locked loop 1130 may include a high-frequency delay line 1131, a low-frequency delay line 1132, a replica 1133, a first phase detector 1134 and a delay controller 1135. Each of the high-frequency delay line 1131 and the low-frequency delay line 1132 may be a digitally controlled delay line. The high-frequency delay line 1131 may receive the divided clock signal ICLK, a delay control signal DC and the frequency information signal EN. When the frequency information signal EN is enabled, the high-frequency delay line 1131 may delay the divided clock signal ICLK based on the delay control signal DC to generate the first delay locked clock signal CLKDLL1. When the frequency information signal EN is disabled, the high-frequency delay line 1131 may be deactivated. The low-frequency delay line 1132 may receive the buffered clock signal CLKR and the delay control signal DC. The low-frequency delay line 1132 may delay the buffered clock signal CLKR based on the delay control signal DC to generate the second delay locked clock signal CLKDLL2. The high-frequency delay line 1131 may be a high-frequency digitally controlled delay line. The low-frequency delay line 1132 may be a low-frequency digitally controlled delay line.

The replica 1133 may receive one between the first output clock signal ICLKD1 and the second output clock signal ICLKD2. When the frequency information signal EN is enabled, the replica 1133 may receive the first output clock signal ICLKD1 and may delay the first output clock signal ICLKD1 by an amount of modelled delay time to generate a first feedback clock signal FBCLK1. When the frequency information signal EN is disabled, the replica 1133 may receive the second output clock signal ICLKD2 and may delay the second output clock signal ICLKD2 by an amount of the modelled delay time to generate the first feedback clock signal FBCLK1. In an embodiment, the replica 1133 may be modified to receive one among the plurality of internal clock signals ICLKD, QCLKD, IBCLKD and QBCLKD, which are output from the clock generation circuit 1150, regardless of the frequency information signal EN. For example, the replica 1133 may be modified to receive the internal clock signal ICLKD, which has a phase corresponding to the first output clock signal ICLKD1 and the second output clock signal ICLKD2 among the plurality of internal clock signals ICLKD, QCLKD, IBCLKD and QBCLKD.

The first phase detector 1134 may compare the phases between the divided clock signal ICLK, which is provided as the reference clock signal, and the first feedback clock signal FBCLK1 to generate the first phase detection signal PD1. The delay controller 1135 may generate the delay control signal DC based on the first phase detection signal PD1. The delay controller 1135 may increase or decrease the value of the delay control signal DC according to the logic level of the first phase detection signal PD1. The delay control signal DC may be provided commonly to the high-frequency delay line 1131 and the low-frequency delay line 1132. The delay amounts of the high-frequency delay line 1131 and the low-frequency delay line 1132 may be set on the basis of the delay control signal DC.

The first delay locked loop 1130 may further include a clock selector 1136. The clock selector 1136 may receive the first output clock signal ICLKD1, the second output clock signal ICLKD2 and the frequency information signal EN. The clock selector 1136 may receive, based on the frequency information signal EN, one between the first output clock signal ICLKD1 and the second output clock signal ICLKD2. The clock selector 1136 may be coupled to the replica 1133. The clock signal output from the clock selector 1136 may be input to the replica 1133. When the frequency information signal EN is enabled, the clock selector 1136 may output the first output clock signal ICLKD1 to the replica 1133. When the frequency information signal EN is disabled, the clock selector 1136 may output the second output clock signal ICLKD2 to the replica 1133.

The second delay locked loop 1140 may include a voltage-controlled delay line 1141, a calibration circuit 1142, a second phase detector 1143 and a charge pump 1144. The voltage-controlled delay line 1141 may receive the first delay locked clock signal CLKDLL1 and a delay control voltage VC. The voltage-controlled delay line 1141 may delay the first delay locked clock signal CLKDLL1 based on the delay control voltage VC to generate the first output clock signal ICLKD1 and a second feedback clock signal FBCLK2. The voltage-controlled delay line 1141 may delay the first delay locked clock signal CLKDLL1 to generate the first set of plural output clock signals QCLKD1, IBCLKD1 and QBCLKD1 other than the first output clock signal ICLKD1. The calibration circuit 1142 may receive the first output clock signal ICLKD1 and the second feedback clock signal FBCLK2. The calibration circuit 1142 may detect the phases of the first output clock signal ICLKD1 and the second feedback clock signal FBCLK2. The calibration circuit 1142 may delay the first output clock signal ICLKD1 to generate a delayed reference clock signal REFD. The calibration circuit 1142 may delay the second feedback clock signal FBCLK2 to generate a delayed feedback clock signal FEBD. The calibration circuit 1142 may compensate for a phase error between the first output clock signal ICLKD1 and the second feedback clock signal FBCLK2, which may occur due to the configurations of the second delay locked loop 1140. Accordingly, the second delay locked loop 1140 to perform a precise delay-locking operation. The calibration circuit 420 illustrated in FIG. 4 may be applied as the calibration circuit 1142. The second phase detector 1143 may receive the delayed reference clock signal REFD and the delayed feedback clock signal FEBD. The second phase detector 1143 may detect the phases of the delayed reference clock signal REFD and the delayed feedback clock signal FEBD to generate a second phase detection signal PD2. The second phase detection signal PD2 may include an up signal UP and a down signal DN. The charge pump 1144 may receive the second phase detection signal PD2. The charge pump 1144 may generate the delay control voltage VC based on the second phase detection signal PD2. The charge pump 1144 may raise the voltage level of the delay control voltage VC based on the up signal UP and may lower the voltage level of the delay control voltage VC based on the down signal DN.

The clock generation circuit 1150 may include a multi-phase clock generator 1151 and a clock selector 1152. The multi-phase clock generator 1151 may receive the second delay locked clock signal CLKDLL2. The multi-phase clock generator 1151 may generate the second set of plural output clock signals ICLKD2, QCLKD2, IBCLKD2 and QBCLKD2 from the second delay locked clock signal CLKDLL2. The multi-phase clock generator 1151 may divide the phase of the second delay locked clock signal CLKDLL2 and divide the frequency of the second delay locked clock signal CLKDLL2 to generate the second set of plural output clock signals ICLKD2, QCLKD2, IBCLKD2 and QBCLKD2 having predetermined phase difference therebetween. Although not illustrated, the multi-phase clock generator 1151 may include configurations such as a phase splitter, a divider and so forth. The clock selector 1152 may receive the frequency information signal EN, the first set of plural output clock signals ICLKD1, QCLKD1, IBCLKD1 and QBCLKD1 and the second set of plural output clock signals ICLKD2, QCLKD2, IBCLKD2 and QBCLKD2. Based on the frequency information signal EN, the clock selector 1152 may output, as the plurality of internal clock signals ICLKD, QCLKD, IBCLKD and QBCLKD, one between the first set of plural output clock signals ICLKD1, QCLKD1, IBCLKD1 and QBCLKD1 and the second set of plural output clock signals ICLKD2, QCLKD2, IBCLKD2 and QBCLKD2. When the frequency information signal EN is enabled, the clock selector 1152 may output the first set of plural output clock signals ICLKD1, QCLKD1, IBCLKD1 and QBCLKD1 as the plurality of internal clock signals ICLKD, QCLKD, IBCLKD and QBCLKD. When the frequency information signal EN is disabled, the clock selector 1152 may output the second set of plural output clock signals ICLKD2, QCLKD2, IBCLKD2 and QBCLKD2 as the plurality of internal clock signals ICLKD, QCLKD, IBCLKD and QBCLKD.

The semiconductor apparatus 1100 may include a command receiver 1210, a command decoder 1220, a command delay line 1230, a clock generation replica 1240, a delay cell replica 1250, a command selector 1260 and a synchronization circuit 1270. The command receiver 1210 may receive a command signal CMD provided from an external of the semiconductor apparatus 1100. The command signal CMD may be a control signal for controlling the semiconductor apparatus 1100 to perform various operations. The command signal CMD may include a plurality of signals of different kinds. The command decoder 1220 may decode the command signal CMD, which is provided through the command receiver 1210, to generate an internal command signal ICMD. The command decoder 1220 may generate the internal command signal ICMD of various kinds based on the command signal CMD. For example, the internal command signal ICMD may include but might not be limited to an active command signal, a precharge command signal, a read command signal, a write command signal, an on-die termination command signal, a refresh command signal and so forth. The command decoder 1220 may latch the command signal CMD, which is provided through the command receiver 1210, based on the buffered clock signal CLKR. The command decoder 1220 may decode the latched command signal to generate the internal command signal ICMD.

The command delay line 1230 may receive the internal command signal ICMD and the delay control signal DC. The command delay line 1230 may delay the internal command signal ICMD based on the delay control signal DC to generate a delayed command signal DCMD. The delay amount of the command delay line 1230 may be set on the basis of the delay control signal DC. The command delay line 1230 may have substantially the same configuration as the high-frequency delay line 1131 and/or the low-frequency delay line 1132. Since the command delay line 1230, the frequency delay line 1131 and the low-frequency delay line 1132 commonly receive the delay control signal DC, the delay amount of the command delay line 1230 may set to be substantially the same as the delay amount of the high-frequency delay line 1131 and/or the delay amount of the low-frequency delay line 1132. The internal command signal ICMD may be delayed through the command delay line 1230 by an time as much as the divided clock signal ICLK or the buffered clock signal CLKR is delayed through the high-frequency delay line 1131 or the low-frequency delay line 1132.

The clock generation replica 1240 may delay the delayed command signal DCMD to generate an additionally delayed command signal. The clock generation replica 1240 may be a circuit, to which the clock generation circuit 1150 is modelled. The clock generation replica 1240 may further delay the delayed command signal DCMD by a time that is taken for the clock generation circuit 1150 to generate the second set of plural output clock signals ICLKD2, QCLKD2, IBCLKD2 and QBCLKD2. The clock generation circuit 1150 may generate the second set of plural output clock signals ICLKD2, QCLKD2, IBCLKD2 and QBCLKD2 from the second delay locked clock signal CLKDLL2 that is delayed through the low-frequency delay line 1132. Therefore, the clock generation replica 1240 may delay the delayed command signal DCMD by an time that is taken for the second set of plural output clock signals ICLKD2, QCLKD2, IBCLKD2 and QBCLKD2 to be generated from the second delay locked clock signal CLKDLL2 thereby matching timing of the command signal output from the clock generation replica 1240 to the phases of the second set of plural output clock signals ICLKD2, QCLKD2, IBCLKD2 and QBCLKD2.

The delay cell replica 1250 may be a circuit, to which at least one among a plurality of delay cells configuring the voltage-controlled delay line 1141 is modelled. A number of delay cells included in the delay cell replica 1250 may correspond to a number of delay cells utilized to generate the first output clock signal ICLKD1 from the first delay locked clock signal CLKDLL1. For example, when the first delay locked clock signal CLKDLL1 is delayed through one delay cell to be generated as the first output clock signal ICLKD1 within the voltage-controlled delay line 1141, the delay cell replica 1250 may be configured to include one delay cell. The delay cell replica 1250 may receive the delayed command signal DCMD and the delay control signal DC and may delay the delayed command signal DCMD based on the delay control voltage VC to generate the additionally delayed command signal. The first delay locked clock signal CLKDLL1 delayed through the high-frequency delay line 1131 may be further delayed through the voltage-controlled delay line 1141 of the second delay locked loop 1140. The delay cell replica 1250 may delay the delayed command signal DCMD by an time that is taken for the first set of plural output clock signals ICLKD1, QCLKD1, IBCLKD1 and QBCLKD1 to be generated from the first delay locked clock signal CLKDLL1 thereby matching timing of the command signal output from the delay cell replica 1250 to the phases of the first set of plural output clock signals ICLKD1, QCLKD1, IBCLKD1 and QBCLKD1.

The command selector 1260 may receive the output signal from the clock generation replica 1240, the output signal from the delay cell replica 1250 and the frequency information signal EN. Based on the frequency information signal EN, the command selector 1260 may output, as an asynchronized command signal ASCMD, one between the output signal from the clock generation replica 1240 and the output signal from the delay cell replica 1250. When the frequency information signal EN is enabled, the command selector 1260 may output the output signal from the delay cell replica 1250 as the asynchronized command signal ASCMD. When the frequency information signal EN is disabled, the command selector 1260 may output the output signal from the clock generation replica 1240 as the asynchronized command signal ASCMD.

The synchronization circuit 1270 may receive the asynchronized command signal ASCMD and one among the plurality of internal clock signals ICLKD, QCLKD, IBCLKD and QBCLKD. For example, the synchronization circuit 1270 may receive the internal clock signal ICLKD. The synchronization circuit 1270 may change the domain of the asynchronized command signal ASCMD. The synchronization circuit 1270 may synchronize the asynchronized command signal ASCMD to the internal clock signal ICLKD to output a synchronized command signal SCMD. The synchronization circuit 1270 may transform the asynchronized command signal ASCMD into the synchronized command signal SCMD, which is synchronized with the internal clock signal ICLKD. Internal circuits of the semiconductor apparatus 1100 may utilize the synchronized command signal SCMD. In an embodiment, the synchronization circuit 1270 may be modified to generate the synchronized command signal SCMD, which is synchronized with the internal clock signal QCLKD.

Figure 12:
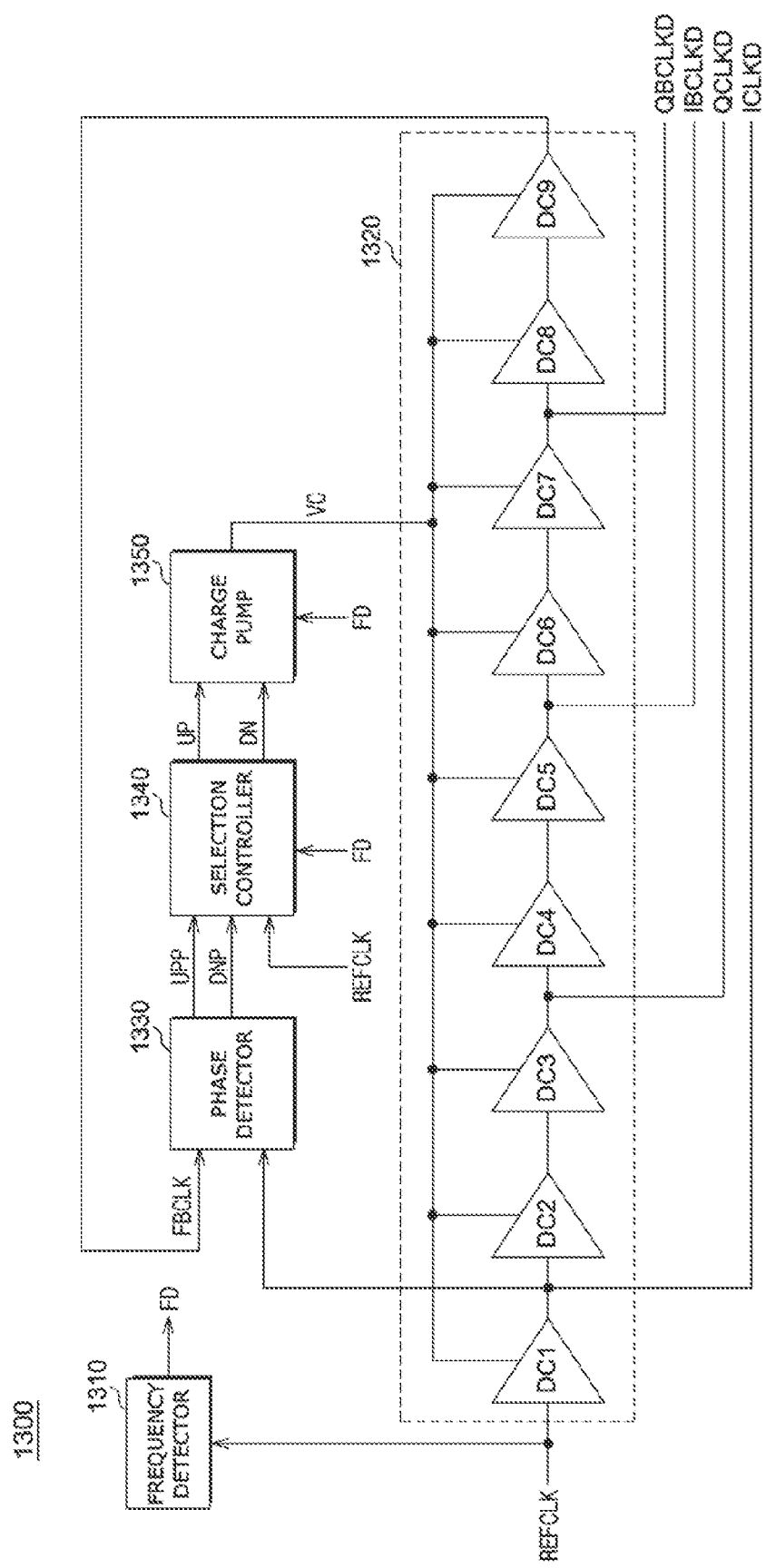
FIG. 12 is a diagram illustrating a configuration of an analogue delay locked loop circuit in accordance with an embodiment.

FIG. 12 is a diagram illustrating a configuration of an analogue delay locked loop circuit 1300 in accordance with an embodiment. The analogue delay locked loop circuit 1300 may be applied as the second delay locked loop 122 illustrated in FIG. 1 and may replace the second delay locked loop 220 illustrated in FIG. 2. The analogue delay locked loop circuit 1300 may receive a reference clock signal REFCLK and may perform a delay-lock operation on the reference clock signal REFCLK to generate a plurality of internal clock signals ICLKD, QCLKD, IBCLKD, and QBCLKD. When the analogue delay locked loop circuit 1300 replaces the second delay locked loop 220 illustrated in FIG. 2, the reference clock signal REFCLK may correspond to the delay locked clock signal CLKDLL. The analogue delay locked loop circuit 1300 may detect the frequency of the reference clock signal REFCLK to prevent uneven deterioration from occurring in the elements of the analogue delay locked loop circuit 1300. When the frequency of the reference clock signal REFCLK provided to the analogue delay locked loop circuit 1300 goes beyond the operation frequency of the analogue delay locked loop circuit 1300, there may occur asymmetrical deterioration in the analogue delay locked loop circuit 1300. The asymmetrical deterioration may cause the static phase error of the analogue delay locked loop circuit 1300. For example, while the analogue delay locked loop circuit 1300 may perform a normal delay-lock operation on the reference clock signal REFCLK having a higher frequency than a reference frequency, the analogue delay locked loop circuit 1300 may tend to be asymmetrically deteriorated when receiving the reference clock signal REFCLK having a lower frequency than the reference frequency. The reference frequency may be defined as a minimum frequency, at which the analogue delay locked loop circuit 1300 may perform a normal delay-lock operation. The analogue delay locked loop circuit 1300 may detect the frequency of the reference clock signal REFCLK. When the frequency of the reference clock signal REFCLK becomes lower than the reference frequency, the analogue delay locked loop circuit 1300 may control at least part of the elements of the analogue delay locked loop circuit 1300 by the reference clock signal REFCLK thereby preventing the asymmetrical deterioration from occurring in the elements within the analogue delay locked loop circuit 1300.

The analogue delay locked loop circuit 1300 may include a frequency detector 1310, a delay line 1320, a phase detector 1330, a selection controller 1340, and a charge pump 1350. The frequency detector 1310 may receive the reference clock signal REFCLK and may detect the frequency of the reference clock signal REFCLK. The frequency detector 1310 may generate a frequency detection signal FD by detecting the frequency of the reference clock signal REFCLK. The frequency detector 1310 may enable the frequency detection signal FD when the frequency of the reference clock signal REFCLK is lower than the reference frequency and may disable the frequency detection signal FD when the frequency of the reference clock signal REFCLK is higher than the reference frequency. The reference frequency may be arbitrarily determined. The reference frequency may be low enough to cause the uneven deterioration in the frequency detector 1310.

The delay line 1320 may receive the reference clock signal REFCLK and a delay control voltage VC. Based on the delay control voltage VC, the delay line 1320 may delay the reference clock signal REFCLK to generate the plurality of delayed clock signals ICLKD, QCLKD, IBCLKD and QBCLKD. The delay line 1320 may be a voltage controlled delay line. A delay amount of the delay line 1320 may be set based on the delay control voltage VC that is an analogue voltage signal. The delay line 1320 may gradually delay the reference clock signal REFCLK by the delay amount, which is set based on the delay control voltage VC, to generate the plurality of delayed clock signals ICLKD, QCLKD, IBCLKD, and QBCLKD. The delay line 1320 may output four signals among a plurality of delayed clock signals as first to fourth internal clock signals ICLKD, QCLKD, IBCLKD, and QBCLKD and may output another one signal among the plurality of delayed clock signals as a feedback clock signal FBCLK.

The delay line 1320 may include a plurality of delay cells. FIG. 12 exemplifies the delay line 1320 having nine number of delay cells DC1, DC2, DC3, DC4, DC5, DC6, DC7, DC8, and DC9, which will not limit the present disclosure. The delay line 1320 may include less or more than nine number of delay cells. The delay line 1320 may output, as the first internal clock signal ICLKD, the delayed clock signal from the first delay cell DC1. The first internal clock signal ICLKD may be provided as an internal reference clock signal. The delay line 1320 may output, as the second internal clock signal QCLKD, the delayed clock signal from the third delay cell DC3. The delay line 1320 may output, as the third internal clock signal IBCLKD, the delayed clock signal from the fifth delay cell DC5. The delay line 1320 may output, as the fourth internal clock signal QBCLKD, the delayed clock signal from the seventh delay cell DC7. The delay line 1320 may output, as the feedback clock signal FBCLK, the delayed clock signal from the last delay cell DC9.

The phase detector 1330 may receive the internal reference clock signal ICLKD and the feedback clock signal FBCLK. The phase detector 1330 may generate a phase detection signal based on phases of the feedback clock signal FBCLK and the first internal clock signal ICLKD provided as the internal reference clock signal. For example, the phase detection signal may include a first detection signal UPP and a second detection signal DNP. The phase detector 1330 may enable the first detection signal UPP based on the phase of the first internal clock signal ICLKD and may enable the second detection signal DNP based on the phase of the feedback clock signal FBCLK. The phase detector 1330 may enable the first detection signal UPP when the phase of the first internal clock signal ICLKD transitions from a low logic level to a high logic level. The phase detector 1330 may enable the second detection signal DNP when the phase of the feedback clock signal FBCLK transitions from a low logic level to a high logic level. The phase detector 1330 may reset the first detection signal UPP and the second detection signal DNP after a lapse of a predetermined amount of time. The phase detector 1330 may disable both the first detection signal UPP and the second detection signal DNP after the predetermined amount of time lapses from when any signal, which is enabled later between the first detection signal UPP and the second detection signal DNP, becomes enabled. The predetermined amount of time may be shorter than an amount of time corresponding to a half period of the reference clock signal REFCLK and/or the feedback clock signal FBCLK.

The selection controller 1340 may receive the reference clock signal REFCLK, the first detection signal UPP, the second detection signal DNP and the frequency detection signal FD to generate an up-signal UP and a down-signal DN. Based on the frequency detection signal FD, the selection controller 1340 may selectively provide the reference clock signal REFCLK, the first detection signal UPP and the second detection signal DNP, as the up-signal UP and the down-signal DN. When the frequency detection signal FD stays disabled, the selection controller 1340 may provide the first detection signal UPP and the second detection signal DNP respectively as the up-signal UP and the down-signal DN. The selection controller 1340 may provide the first detection signal UPP as the up-signal UP and may provide the second detection signal DNP as the down-signal DN. When the frequency detection signal FD becomes enabled, the selection controller 1340 may provide the reference clock signal REFCLK as both the up-signal UP and the down-signal DN.

The charge pump 1350 may receive the up-signal UP and the down-signal DN. The charge pump 1350 may generate the delay control voltage VC based on the up-signal UP and the down-signal DN. The charge pump 1350 may raise the voltage level of the delay control voltage VC based on the up-signal UP and may lower the voltage level of the delay control voltage VC based on the down-signal DN. For example, when the voltage level of the delay control voltage VC rises, the delay time of the delay cells DC1 to DC9 configuring the delay line 1320 may decrease. When the voltage level of the delay control voltage VC falls, the delay time of the delay cells DC1 to DC9 configuring the delay line 1320 may increase. The analogue delay locked loop circuit 1300 may perform the delay-lock operation by changing the voltage level of the delay control voltage VC until the internal reference signal ICLKD is in phase with the feedback clock signal FBCLK. When the internal reference signal ICLKD is in phase with the feedback clock signal FBCLK, the analogue delay locked loop circuit 1300 may fix the voltage level of the delay control voltage VC and may be locked. The charge pump 1350 may further receive the frequency detection signal FD. The charge pump 1350 may control the delay control voltage VC to have a logic level based on the frequency detection signal FD. When the frequency detection signal FD becomes enabled, the charge pump 1350 may raise or lower the voltage level of the delay control voltage VC in order for the delay cells DC1 to DC9 of the delay line 1320 to be turned on. For example, the charge pump 1350 may raise, based on the frequency detection signal FD, the voltage level of the delay control voltage VC to an enough level for the delay control voltage VC to be determined to have a high logic level. Alternatively, the charge pump 1350 may lower, based on the frequency detection signal FD, the voltage level of the delay control voltage VC to an enough level for the delay control voltage VC to be determined to have a low logic level.

Figure 13:
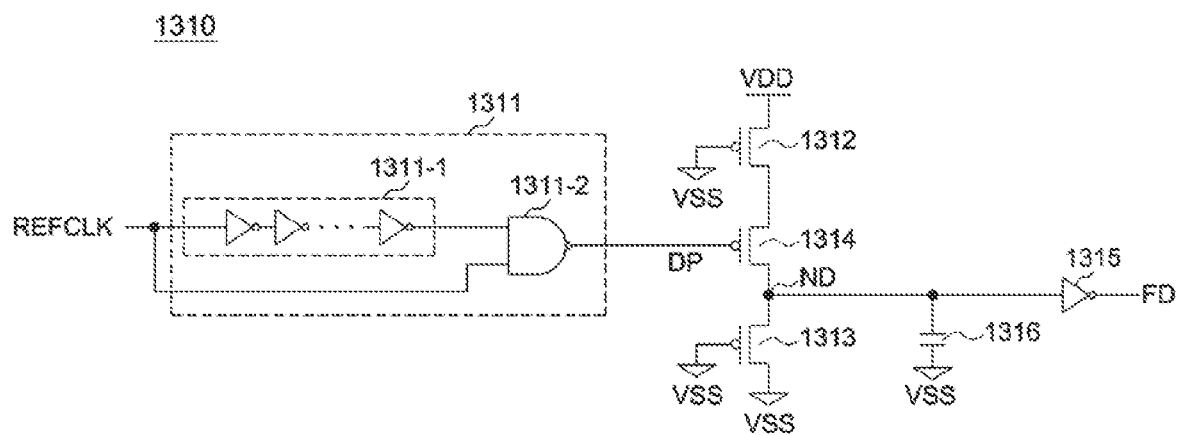
FIG. 13 is a diagram illustrating a configuration of a frequency detector illustrated in FIG. 12.

FIG. 13 is a diagram illustrating a configuration of the frequency detector 1310 illustrated in FIG. 12. Referring to FIG. 13, the frequency detector 1310 may include a pulse generator 1311, a first transistor 1312, a second transistor 1313, a third transistor 1314 and an inverter 1315. The pulse generator 1311 may receive the reference clock signal REFCLK and may generate a detection pulse signal DP based on the reference clock signal REFCLK. The pulse generator 1311 may include a delay unit 1311-1 and a NAND gate 1311-2. The delay unit 1311-1 may include an odd number of inverters. The NAND gate 1311-2 may perform a NAND operation on the reference clock signal REFCLK and an output of the delay unit 1311-1 to generate the detection pulse signal DP. In synchronization with a rising edge of the reference clock signal REFCLK, the pulse generator 1311 may generate the detection pulse signal DP having a pulse width corresponding to the delay time of the delay unit 1311-1 and transitioning to a low logic level. The pulse generator 1311 may generate the detection pulse signal DP having a greater number of pulses as the frequency of the reference clock signal REFCLK becomes higher and may generate the detection pulse signal DP having a smaller number of pulses as the frequency of the reference clock signal REFCLK becomes lower.

Each of the first to third transistors 1312, 1313 and 1314 may be a P-channel MOS transistor. The first transistor 1312 may receive a power voltage VDD at its source and may receive a ground voltage VSS at its gate. The second transistor 1313 may receive the ground voltage VSS at its gate and drain. The third transistor 1314 may be coupled, at its source, to a drain of the first transistor 1312. The third transistor 1314 may be coupled, at its drain, to a source of the second transistor 1313. The third transistor 1314 may receive the detection pulse signal DP at its gate. Because the first transistor 1312 and the second transistor 1313 receive the ground voltage VSS at their respective gates, the first transistor 1312 and the second transistor 1313 may be always turned on. The first transistor 1312 may transfer the power voltage VDD to the source of the third transistor 1314 and the second transistor 1313 may transfer the ground voltage VSS to the drain of the third transistor 1314. Whenever the detection pulse signal DP transitions to a low logic level, the third transistor 1314 may drive a detection node ND to the voltage level of the power voltage VDD.

The inverter 1315 may invert the voltage level of the detection node ND to generate the frequency detection signal FD. When the voltage level of the detection node ND is a low logic level, the frequency detection signal FD may be enabled to a high logic level. When the voltage level of the detection node ND is a high logic level, the frequency detection signal FD may be disabled to a low logic level. The frequency detector 1310 may further include a capacitor 1316. The capacitor 1316 may be coupled to the detection node ND at one end and may be coupled to the ground voltage VSS at the other end. The capacitor 1316 may stabilize the voltage level of the detection node ND.

As the frequency of the reference clock signal REFCLK becomes higher, the detection pulse signal DP may frequently transition to a low logic level. The third transistor 1314 may be frequently turned on according to the detection pulse signal DP and the voltage level of the detection node ND may rise to the voltage level of the power voltage VDD. Therefore, the detection node ND may have the voltage level corresponding to a high logic level and the frequency detection signal FD may be disabled to a low logic level. As the frequency of the reference clock signal REFCLK becomes lower, the detection pulse signal DP may rarely transition to a low logic level. The third transistor 1314 may also be rarely turned on according to the detection pulse signal DP and the voltage level of the detection node ND may fail to rise to the voltage level corresponding to a high logic level. Therefore, the frequency detection signal FD may be enabled to a high logic level.

Figure 14:
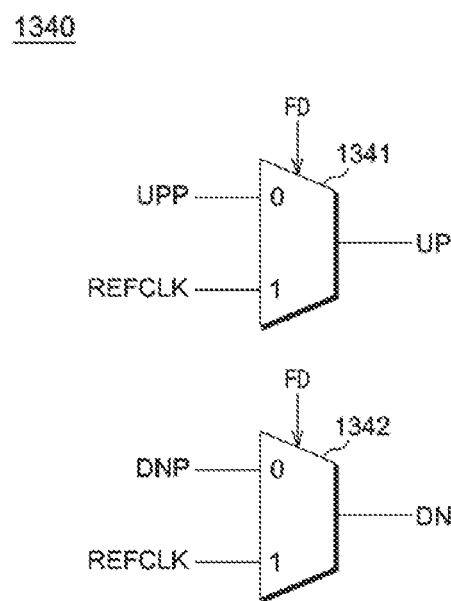
FIG. 14 is a diagram illustrating a configuration of a selection controller illustrated in FIG. 12.

FIG. 14 is a diagram illustrating a configuration of the selection controller 1340 illustrated in FIG. 12. Referring to FIG. 14, the selection controller 1340 may include a first multiplexer 1341 and a second multiplexer 1342. The first multiplexer 1341 may receive the first detection signal UPP, the reference clock signal REFCLK and the frequency detection signal FD to output the up-signal UP. Based on the frequency detection signal FD, the first multiplexer 1341 may output, as the up-signal UP, one of the first detection signal UPP and the reference clock signal REFCLK. When the frequency detection signal FD stays disabled to a low logic level, the first multiplexer 1341 may output the first detection signal UPP as the up-signal UP. When the frequency detection signal FD becomes enabled to a high logic level, the first multiplexer 1341 may output the reference clock signal REFCLK as the up-signal UP. The second multiplexer 1342 may receive the second detection signal DNP, the reference clock signal REFCLK and the frequency detection signal FD to output the down-signal DN. Based on the frequency detection signal FD, the second multiplexer 1342 may output, as the down-signal DN, one of the second detection signal DNP and the reference clock signal REFCLK. When the frequency detection signal FD stays disabled to a low logic level, the second multiplexer 1342 may output the second detection signal DNP as the down-signal DN. When the frequency detection signal FD becomes enabled to a high logic level, the second multiplexer 1342 may output the reference clock signal REFCLK as the down-signal DN.

Figure 15A:
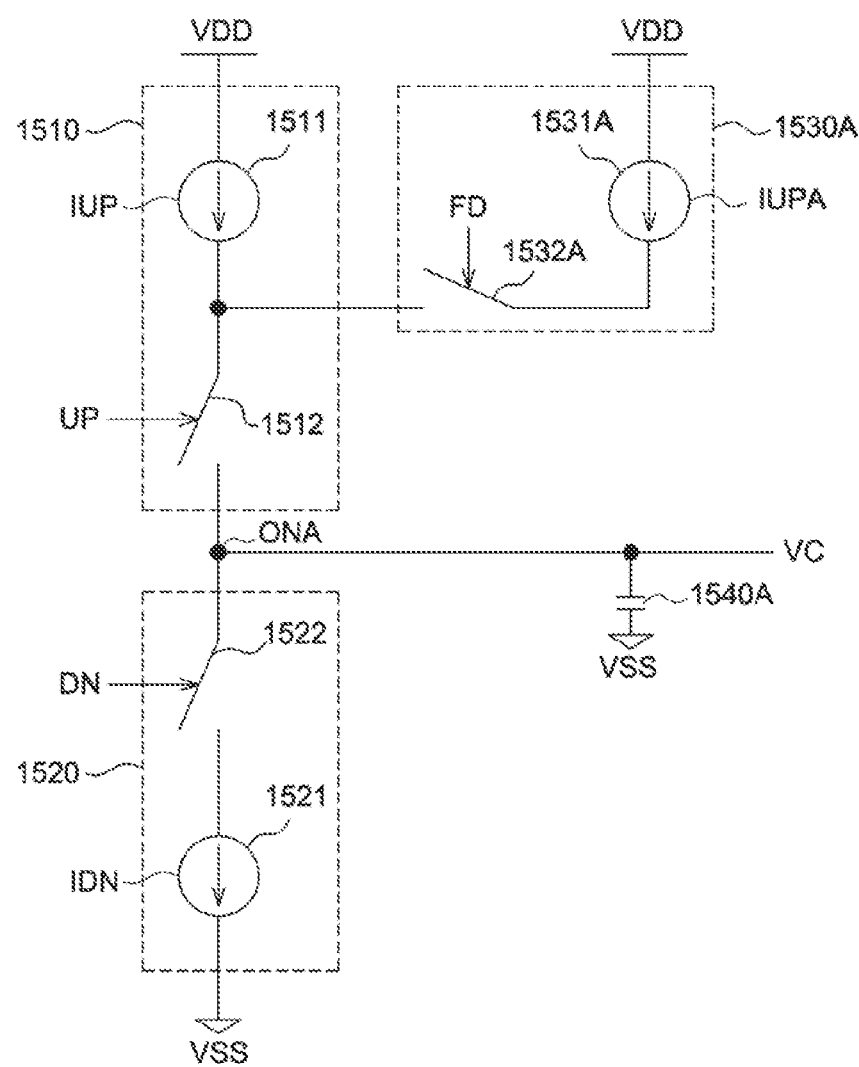
FIGS. 15A and 15B are diagrams illustrating configurations of a charge pump in accordance with an embodiment.
Figure 15B:
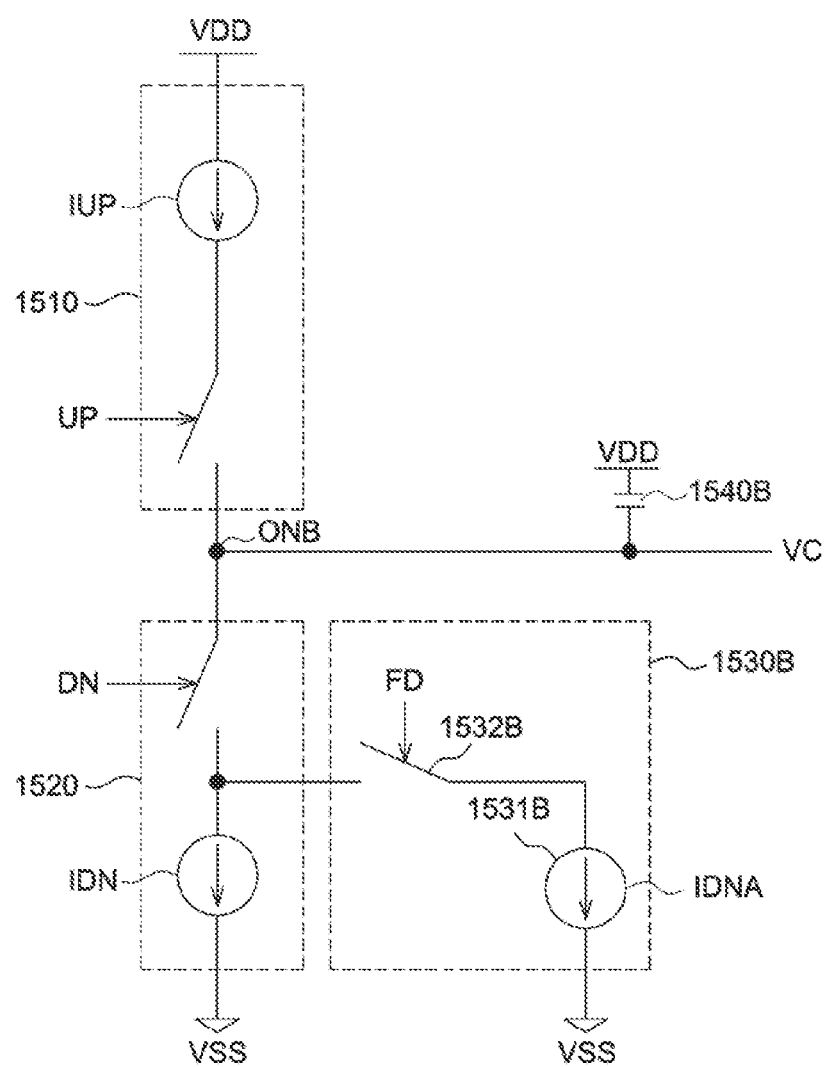

FIGS. 15A and 15B are diagrams illustrating configurations 1500A and 1500B of the charge pump 1350 in accordance with an embodiment. Any of the configurations 1500A and 1500B of the charge pump 1350 may be applied as the charge pump 1350 illustrated in FIG. 12. Referring to FIG. 15A, the charge pump 1500A may include a pull-up circuit 1510, a pull-down circuit 1520, and a turn-on control circuit 1530A. The pull-up circuit 1510 may receive the up-signal UP and may pull-up drive an output node ONA based on the up-signal UP. The delay control voltage VC may output through the output node ONA. When the up-signal UP is enabled, the pull-up circuit 1510 may provide the output node ONA with an up-current IUP to raise the voltage level of the output node ONA. The pull-down circuit 1520 may receive the down-signal DN and may pull-down drive the output node ONA based on the down-signal DN. When the down-signal DN is enabled, the pull-down circuit 1520 may couple the output node ONA with a down current IDN to discharge the output node ONA which in turn may lower the voltage level of the output node ONA. The turn-on control circuit 1530A may receive the frequency detection signal FD and may pull-up drive the output node ONA based on the frequency detection signal FD. When the frequency detection signal FD is enabled, the turn-on control circuit 1530A may provide the output node ONA with an additional up-current IUPA to raise, together with the pull-up circuit 1510, the voltage level of the output node ONA. An amount of the up-current IUP may be substantially the same as an amount of the down-current IDN. An amount of the additional up-current IUPA may be less than the amount of the up-current IUP or the amount of the down-current IDN.

The pull-up circuit 1510 may include an up-current source 1511 and a first switch 1512. The up-current source 1511 may be coupled to the power voltage VDD at one end. The up-current source 1511 may provide, through the first switch 1512, the output node ONA with the up-current IUP. The first switch 1512 may receive the up-signal UP, may be coupled at one end to the other end of the up-current source 1511 and may be coupled at the other end to the output node ONA. When the up-signal UP is enabled, the first switch 1512 may be turned on and may provide the output node ONA with the up-current IUP. The pull-down circuit 1520 may include a down-current source 1521 and a second switch 1522. The down-current source 1521 may be coupled to the ground voltage VSS at one end. The down-current source 1521 may discharge, through the second switch 1522, the down-current IDN from the output node ONA to the ground voltage VSS. The second switch 1522 may receive the down-signal DN, may be coupled at one end to the other end of the down-current IDN and may be coupled at the other end to the output node ONA. When the down-signal DN is enabled, the second switch 1522 may be turned on and may discharge the down-current IDN from the output node ONA.

The turn-on control circuit 1530A may include an additional up-current source 1531A and a third switch 1532A. The additional up-current source 1531A may be coupled to the power voltage VDD at one end. The additional up-current source 1531A may provide, through the third switch 1532A, the output node ONA with the additional up-current IUPA. The third switch 1532A may receive the frequency detection signal FD, may be coupled at one end to the other end of the additional up-current source 1531A and may be coupled at the other end to the output node ONA. When the frequency detection signal FD is enabled, the third switch 1532A may be turned on and may provide the output node ONA with the additional up-current IUPA. The charge pump 1500A may further include a capacitor 1540A. The capacitor 1540A may stabilize the voltage levels of the output node ONA and the delay control voltage VC. The capacitor 1540A may be coupled to the output node ONA at one end and may be coupled to the ground voltage VSS at the other end.

When the frequency detection signal FD becomes disabled, the charge pump 1500A may receive the first detection signal UPP as the up-signal UP and may receive the second detection signal DNP as the down-signal DN, from the selection controller 1340 illustrated in FIG. 12. The pull-up circuit 1510 and the pull-down circuit 1520 may be turned on respectively according to the first detection signal UPP and the second detection signal DNP. The voltage level of the delay control voltage VC may change according to the turn-on of the pull-up circuit 1510 and the turn-on of the pull-down circuit 1520. When the frequency detection signal FD becomes enabled, the charge pump 1500A may receive the reference clock signal REFCLK, as the up-signal UP and the down-signal DN, from the selection controller 1340. Therefore, the pull-up circuit 1510 and the pull-down circuit 1520 may be turned on at the same time and may maintain turned on during the same amount of time and thus the deterioration may evenly occur in the pull-up circuit 1510 and the pull-down circuit 1520. The voltage level of the delay control voltage VC may be maintained to a specific level as the pull-up circuit 1510 and the pull-down circuit 1520 are evenly turned on. For example, the voltage level of the delay control voltage VC may be maintained, by the pull-up circuit 1510 and the pull-down circuit 1520, to a voltage level corresponding to a half of the power voltage VDD. The turn-on control circuit 1530A may pull-up drive the output node ONA based on the frequency detection signal FD. Therefore, the voltage level of the delay control voltage VC may gradually rise to the voltage level of the power voltage VDD. By the turn-on control circuit 1530A, the voltage level of the delay control voltage VC may rise to a level corresponding to a high logic level. When the delay cells DC1 to DC9 of the delay line 1320 have the structure that the delay cells DC1 to DC9 are turned on by the delay control voltage VC having a high logic level as illustrated in FIGS. 8A, 9A, and 10A, the turn-on control circuit 1530A may raise the voltage level of the delay control voltage VC to a level corresponding to a high logic level such that all of the delay cells DC1 to DC9 are turned on. Therefore, the turn-on control circuit 1530A may control deterioration to evenly occur in the delay cells DC1 to DC9.

Referring to FIG. 15B, the charge pump 1500B may include a pull-up circuit 1510, a pull-down circuit 1520, and a turn-on control circuit 1530B. The pull-up circuit 1510 and the pull-down circuit 1520 illustrated in FIG. 15B may have the same configuration and may perform the same function as the pull-up circuit 1510 and the pull-down circuit 1520 illustrated in FIG. 15A, respectively. The turn-on control circuit 1530B may include an additional down-current source 1531B and a third switch 1532B. The additional down-current source 1531B may be coupled to the ground voltage VSS at one end. The additional down-current source 1531B may discharge, through the third switch 1532B, an additional down-current IDNA from an output node ONB to the ground voltage VSS. The third switch 1532B may receive the frequency detection signal FD, may be coupled at one end to the other end of the additional down-current source 1531B and may be coupled at the other end to the output node ONB. When the frequency detection signal FD is enabled, the third switch 1532B may be turned on and may discharge the additional down-current IDNA from the output node ONB. An amount of the additional down-current IDNA may be less than the amount of the up-current IUP or the amount of the down-current IDN.

When the frequency detection signal FD becomes enabled, the turn-on control circuit 1530B may pull-down drive the output node ONB based on the frequency detection signal FD. Therefore, the voltage level of the delay control voltage VC may gradually fall to the voltage level of the ground voltage VSS. By the turn-on control circuit 1530B, the delay control voltage VC may fall to a voltage level corresponding to a low logic level. When the delay cells DC1 to DC9 of the delay line 1320 have the structure that the delay cells DC1 to DC9 are turned on by the delay control voltage VC having a low logic level as illustrated in FIG. 10B, the turn-on control circuit 1530B may lower the voltage level of the delay control voltage VC to a level corresponding to a low logic level such that all of the delay cells DC1 to DC9 are turned on. Therefore, the turn-on control circuit 1530B may control deterioration to evenly occur in the delay cells DC1 to DC9.

Hereinafter, described with reference to FIGS. 12 to 15B will be the operation of the analogue delay locked loop circuit 1300 in accordance with an embodiment. When a semiconductor apparatus including the analogue delay locked loop circuit 1300 operates in a normal mode, the reference clock signal REFCLK may have a higher frequency than the reference frequency and the frequency detector 1310 may keep the frequency detection signal FD disabled. The normal mode may be an operational mode, in which the semiconductor apparatus can be powered up to perform a normal operation. Based on the disabled frequency detection signal FD, the analogue delay locked loop circuit 1300 may perform a general delay-lock operation. Based on the disabled frequency detection signal FD, the selection controller 1340 may provide the first detection signal UPP as the up-signal UP and may provide the second detection signal DNP as the down-signal DN. The phase detector 1330 may compare the phases of the first internal clock signal ICLKD and the feedback clock signal FBCLK to generate the first detection signal UPP and the second detection signal DNP. Therefore, the charge pump 1350 may adjust the voltage level of the delay control voltage VC based on the up-signal UP and the down-signal DN, which are respectively generated according to the first detection signal UPP and the second detection signal DNP. When the first internal clock signal ICLKD is in phase with the feedback clock signal FBCLK, the voltage level of the delay control voltage VC may be kept constant and the delay-lock operation of the analogue delay locked loop circuit 1300 may be completed.

When the semiconductor apparatus including the analogue delay locked loop circuit 1300 operates in a mode other than the normal mode, the reference clock signal REFCLK may have the reference frequency or lower and the frequency detector 1310 may enable the frequency detection signal FD. For example, the mode other than the normal mode may include any of a power-down mode, a stand-by mode, a low-power mode and a test mode of the semiconductor apparatus. Based on the enabled frequency detection signal FD, the selection controller 1340 may provide the reference clock signal REFCLK as the up-signal UP and the down-signal DN. Therefore, the pull-up circuit 1510 and the pull-down circuit 1520 of each of the charge pump 1500A and the charge pump 1500B may be turned on at the same time and may stay turned on for the same amount of time. Accordingly, there may occur even and symmetrical deterioration in the pull-up circuit 1510 and the pull-down circuit 1520. The turn-on control circuits 1530A and 1530B of the charge pump 1500A may change the delay control voltage VC to a high logic level and a low logic level, respectively. Therefore, the delay cells DC1 to DC9 configuring the delay line 1320 may be continuously turned on, which may minimize a phase skew or a phase error due to the uneven deterioration that occurs in the analogue delay locked loop circuit 1300 in the mode other than the normal mode of the semiconductor apparatus.

Figure 16:
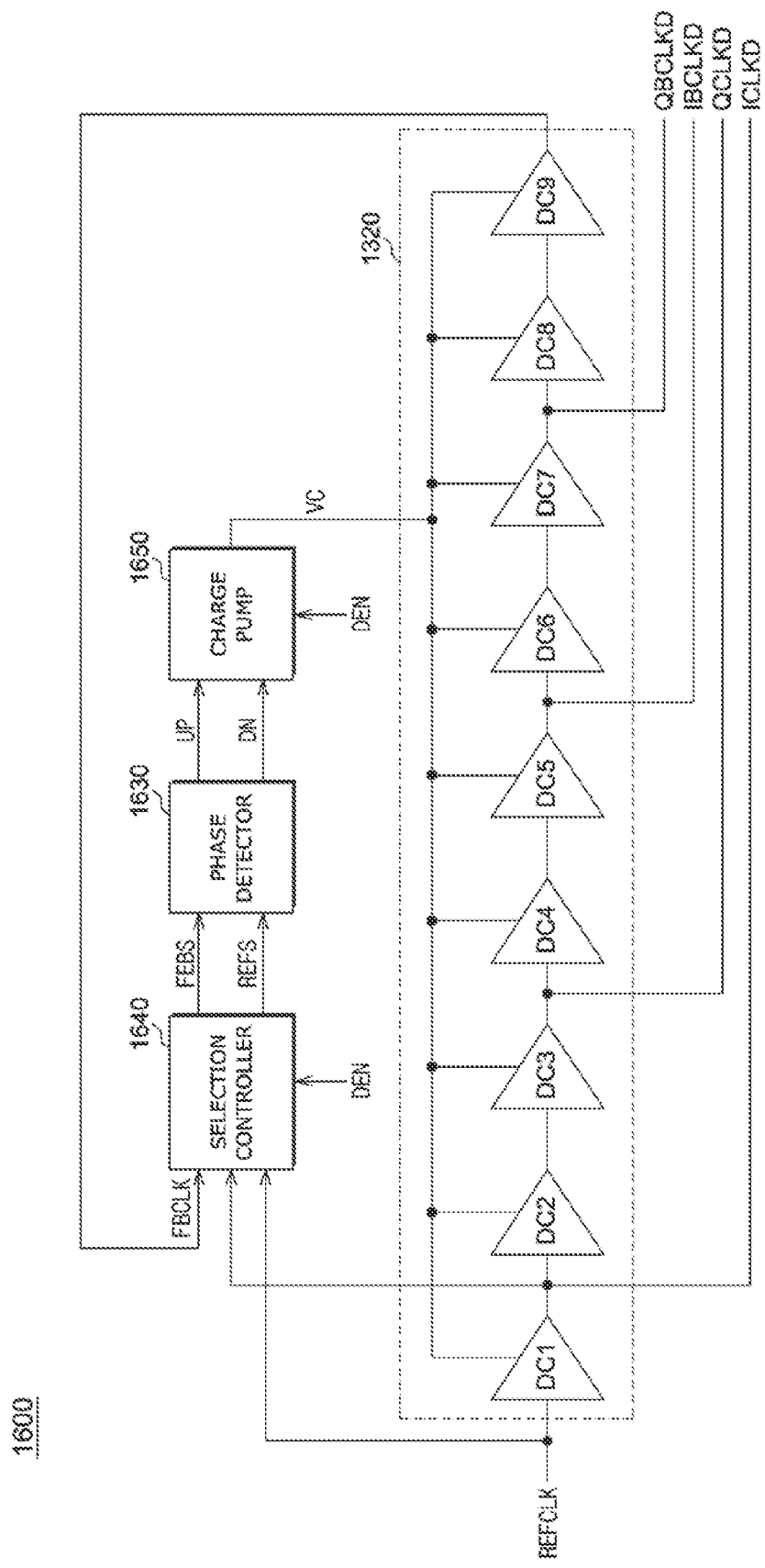
FIG. 16 is a diagram illustrating a configuration of an analogue delay locked loop circuit in accordance with an embodiment.

FIG. 16 is a diagram illustrating a configuration of an analogue delay locked loop circuit 1600 in accordance with an embodiment. Referring to FIG. 16, the analogue delay locked loop circuit 1600 may have a similar configuration as the analogue delay locked loop circuit 1300 illustrated in FIG. 12. In FIGS. 12 and 16, the same element is indicated by the same reference number. The description on the same element will not be repeated here. The analogue delay locked loop circuit 1600 may include the delay line 1320, a selection controller 1640, a phase detector 1630 and a charge pump 1650. The selection controller 1340 may be coupled to the output node of the phase detector 1330 within the analogue delay locked loop circuit 1300 illustrated in FIG. 12 but the selection controller 1640 may be coupled to an input node of the phase detector 1630 within the analogue delay locked loop circuit 1600 illustrated in FIG. 16. The selection controller 1640 may receive the internal reference clock signal (i.e., the first internal clock signal ICLKD), the feedback clock signal FBCLK, the reference clock signal REFCLK and a deterioration enable signal DEN to output a first selection clock signal REFS and a second selection clock signal FEBS. The deterioration enable signal DEN may be enabled when there is a possibility of the asymmetrical deterioration in the analogue delay locked loop circuit 1600. In an embodiment, the deterioration enable signal DEN may be a frequency detection signal generated by detecting the frequency of the reference clock signal REFCLK. When the deterioration enable signal DEN is the frequency detection signal, the analogue delay locked loop circuit 1600 may further include the frequency detector 1310. In an embodiment, the deterioration enable signal DEN may be a control signal provided from an external to the analogue delay locked loop circuit 1600. A semiconductor apparatus including the analogue delay locked loop circuit 1600 may provide the analogue delay locked loop circuit 1600 with the deterioration enable signal DEN, which is enabled, under a situation that there may occur the asymmetrical deterioration within the analogue delay locked loop circuit 1600. For example, the deterioration enable signal DEN may be a DLL disable signal for deactivating the analogue delay locked loop circuit 1600. Based on the deterioration enable signal DEN, the selection controller 1640 may output the internal reference clock signal (i.e., the first internal clock signal ICLKD) and the feedback clock signal FBCLK respectively as the first selection clock signal REFS and the second selection clock signal FEBS or may output the reference clock signal REFCLK as the first selection clock signal REFS and the second selection clock signal FEBS. Based on the deterioration enable signal DEN, which is disabled, the selection controller 1640 may output the internal reference clock signal (i.e., the first internal clock signal ICLKD) as the first selection clock signal REFS and may output the feedback clock signal FBCLK as the second selection clock signal FEBS. Based on the deterioration enable signal DEN, which is enabled, the selection controller 1640 may output the reference clock signal REFCLK as the first selection clock signal REFS and the second selection clock signal FEBS. The selection controller 1640 may have substantially the same configuration as the selection controller 1340 illustrated in FIG. 14 except for the received signals and the output signals thereof.

The phase detector 1630 may receive the first selection clock signal REFS and the second selection clock signal FEBS from the selection controller 1640 and may compare the phases of the first selection clock signal REFS and the second selection clock signal FEBS to generate the up-signal UP and the down-signal DN. When the deterioration enable signal DEN becomes disabled, the phase detector 1630 may receive the internal reference clock signal and the feedback clock signal FBCLK respectively as the first selection clock signal REFS and the second selection clock signal FEBS and therefore may generate the up-signal UP and the down-signal DN according to the phase difference between the internal reference clock signal and the feedback clock signal FBCLK for the analogue delay locked loop circuit 1600 to perform a general delay-lock operation. When the deterioration enable signal becomes enabled, the phase detector 1630 may receive the reference clock signal REFCLK as the first selection clock signal REFS and the second selection clock signal FEBS and therefore may generate the up-signal UP and the down-signal DN at the same time and for the same amount of time, which controls even deterioration to occur in the charge pump 1650 and the delay line 1320 configuring the analogue delay locked loop circuit 1600. The charge pump 1650 may have substantially the same configuration and may operate substantially in the same manner as the charge pump 1350 illustrated in FIG. 12 except the receiving of the deterioration enable signal DEN instead of the frequency detection signal FD. In an embodiment, the analogue delay locked loop circuit 1300 illustrated in FIG. 12 may be modified to utilize the deterioration enable signal DEN instead of the frequency detection signal FD. The selection controller 1340 and the charge pump 1350 of the analogue delay locked loop circuit 1300 may be modified to receive the deterioration enable signal DEN, instead of the frequency detection signal FD, to operate based on the deterioration enable signal DEN, which is similar to the selection controller 1640 and the charge pump 1650 of the analogue delay locked loop circuit 1600. The frequency detector 1310 of the analogue delay locked loop circuit 1300 may be modified to generate the deterioration enable signal DEN instead of the frequency detection signal FD. When the deterioration enable signal DEN is a control signal provided from an external to the analogue delay locked loop circuit 1300, the analogue delay locked loop circuit 1300 might not include the frequency detector 1310.

While certain embodiments have been described above, it will be understood to those skilled in the art that the

What is claimed is:

1. A delay locked loop circuit comprising:
a delay line configured to delay, based on a delay control voltage, a reference clock signal to generate an internal clock signal and a feedback clock signal;
a selection controller configured to provide the internal clock signal and the feedback clock signal respectively as a first selection clock signal and a second selection clock signal when a deterioration enable signal is disabled, and to provide the reference clock signal as the first selection clock signal and the second selection clock signal when the deterioration enable signal is enabled;
a phase detector configured to compare phases of the first selection clock signal and the second selection clock signal to generate an up-signal and a down-signal; and
a charge pump configured to generate the delay control voltage based on the up-signal and the down-signal.

2. The delay locked loop circuit of claim 1,
wherein the charge pump includes:
a pull-up circuit configured to provide an output node with an up-current based on the up-signal;
a pull-down circuit configured to couple the output node to a down-current, based on the down-signal, to discharge the output node; and
a turn-on control circuit configured to provide the output node with an additional up-current based on the deterioration enable signal, and
wherein the delay control voltage is output from the output node.

3. The delay locked loop circuit of claim 2, wherein an amount of the up-current is substantially the same as an amount of the down-current, and an amount of the additional up-current is less than the amount of the up-current or the amount of the down-current.

4. The delay locked loop circuit of claim 2,
wherein the delay line includes at least one delay cell configured to delay, based on the delay control voltage, an input signal to generate an output signal, and
wherein the at least one delay cell is turned on based on the delay control voltage having a voltage level corresponding to a high logic level.

5. The delay locked loop circuit of claim 1,
wherein the charge pump includes:
a pull-up circuit configured to provide an output node with an up-current based on the up-signal;
a pull-down circuit configured to couple the output node to a down-current, based on the down-signal, to discharge the output node; and
a turn-on control circuit configured to discharge an additional down-current from the output node based on the deterioration enable signal, and
wherein the delay control voltage is output from the output node.

6. The delay locked loop circuit of claim 5, wherein an amount of the up-current is substantially the same as an amount of the down-current, and an amount of the additional down-current is less than the amount of the up-current or the amount of the down-current.

7. The delay locked loop circuit of claim 5,
wherein the delay line includes at least one delay cell configured to delay, based on the delay control voltage, an input signal to generate an output signal, and
wherein the at least one delay cell is turned on based on the delay control voltage having a voltage level corresponding to a low logic level.

8. A delay locked loop circuit comprising:
a delay line configured to delay, based on a delay control voltage, a reference clock signal to generate an internal clock signal and a feedback clock signal;
a circuit configured to generate an up-signal and a down-signal based on the internal clock signal and the feedback clock signal when a deterioration enable signal is disabled, and to generate the up-signal and the down-signal only based on the reference clock signal when the deterioration enable signal is enabled; and
a charge pump configured to generate the delay control voltage based on the up-signal and the down-signal.

9. A semiconductor apparatus comprising a delay locked loop circuit,
wherein the delay locked loop circuit includes a delay line configured to delay, based on a delay control voltage, a reference clock signal to generate an internal clock signal and a feedback clock signal,
wherein the delay locked loop circuit generates the delay control voltage based on the internal clock signal and the feedback clock signal when a deterioration enable signal is disabled, and generates the delay control voltage only based on the reference clock signal when the deterioration enable signal is enabled.

* * * * *